United States Patent
Oshima

(10) Patent No.: US 6,794,116 B2
(45) Date of Patent: Sep. 21, 2004

(54) NEGATIVE PHOTOSENSITIVE LITHOGRAHIC PRINTING PLATE

(75) Inventor: Yasuhito Oshima, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 168 days.

(21) Appl. No.: 09/989,527

(22) Filed: Nov. 21, 2001

(65) Prior Publication Data

US 2002/0142249 A1 Oct. 3, 2002

(30) Foreign Application Priority Data

Nov. 22, 2000 (JP) ..................................... P.2000-356182

(51) Int. Cl.$^7$ .............................................. G03F 7/038
(52) U.S. Cl. ................................ 430/281.1; 430/286.1; 430/287.1; 430/302
(58) Field of Search .......................... 430/270.1, 281.1, 430/283.1, 284.1, 285.1, 286.1, 287.1, 288.1, 302

(56) References Cited

U.S. PATENT DOCUMENTS

| | | | |
|---|---|---|---|
| 3,448,089 A | * 6/1969 | Celeste ........................ 525/286 |
| 4,228,232 A | 10/1980 | Rousseau | |
| 4,340,686 A | * 7/1982 | Foss ............................. 525/59 |
| 4,478,977 A | 10/1984 | Sperry et al. | |
| 4,517,277 A | * 5/1985 | Lynch et al. ............. 430/281.1 |
| 4,774,161 A | 9/1988 | Sekiya et al. | |
| 5,750,313 A | * 5/1998 | Tamada et al. .......... 430/280.1 |
| 5,849,842 A | 12/1998 | Timpe et al. | |
| 2002/0136987 A1 | * 9/2002 | Oshima .................... 430/281.1 |
| 2002/0182539 A1 | * 12/2002 | Fujimaki et al. ......... 430/281.1 |
| 2003/0008239 A1 | * 1/2003 | Fujimaki et al. ......... 430/281.1 |
| 2003/0146965 A1 | * 8/2003 | Fujimaki et al. ............ 347/105 |

FOREIGN PATENT DOCUMENTS

| | | |
|---|---|---|
| EP | 0 211 406 A2 | 2/1987 |
| EP | 0 752 430 A2 | 1/1997 |
| EP | 0 779 553 A1 | 6/1997 |
| EP | 1 081 552 A1 | 3/2001 |
| EP | 1 204 000 A1 | 5/2002 |
| JP | 2000-181062 | 6/2000 |
| WO | WO 97/33202 | 9/1997 |
| WO | WO 0167179 A2 | 9/2001 |

OTHER PUBLICATIONS

Ege, S. N. Organic Chemistry Second Edition, Lexington, D.C. Heath and Company, 1989. pp. 96–100.*

* cited by examiner

Primary Examiner—Mark F. Huff
Assistant Examiner—Barbara Gilliam
(74) Attorney, Agent, or Firm—Burns, Doane, Swecker & Mathis, L.L.P.

(57) ABSTRACT

A negative photosensitive lithographic printing plate comprises: a support; and a photosensitive layer containing: i) a modified poly(vinyl alcohol) resin binder having a radical-polymerizable group and an acid group; and ii) at least one of a photo-polymerization initiator and a heat-polymerization initiator.

16 Claims, No Drawings

NEGATIVE PHOTOSENSITIVE LITHOGRAHIC PRINTING PLATE

FIELD OF THE INVENTION

The present invention relates to a negative photosensitive lithographic printing plate. More particularly, the invention relates to a negative photosensitive lithographic printing plate suitable for drawing with a laser beam.

BACKGROUND OF THE INVENTION

PS plates comprising a hydrophilic support and an oleophilic photosensitive resin layer formed thereon have hitherto been widely used as negative photosensitive lithographic printing plates. In general, a desired printing plate has been obtained from the PS plate by subjecting it to exposure to light (a real exposure) through a mask, i.e., a lith film, and then removing the nonimage areas by dissolution.

In recent years, the digitization technology in which image information is electronically processed, stored, and outputted with a computer is spreading widely. With this trend, various new techniques for image output which are suitable for the digitization technology have come to be practically used. As a result, it is desired to establish a computer-to-plate (CTP) technology in which a photosensitive resin layer is scanned with a highly directional light such as a laser beam according to digitized image information to thereby directly produce a printing plate without via the use of a lith film. An important technical subject therefore is to obtain a negative photosensitive lithographic printing plate suitable for use in that technology.

A negative photosensitive lithographic printing plate capable of such scanning exposure has been proposed which comprises a hydrophilic support and formed thereon an oleophilic photosensitive resin layer (hereinafter referred to also as "photosensitive layer") containing a photosensitive compound capable of generating an active species such as radicals or a Brφnstead acid, upon exposure to a laser beam. The negative photosensitive lithographic printing plate has already been put on the market. From this negative photosensitive lithographic printing plate can be obtained a negative lithographic printing plate by scanning it with a laser beam based on digital information to generate an active species, causing the photosensitive layer to undergo a physical or chemical change by the action of the active species to thereby insolubilize the exposed areas of the layer, and subsequently developing the layer.

In particular, a negative photosensitive lithographic printing plate which comprises a hydrophilic support and formed thereon a photopolymerization type photosensitive layer having a high photosensitization speed containing a photopolymerization initiator, an ethylenically unsaturated compound capable of undergoing addition polymerization, and a polymeric binder soluble in an alkaline developing solution and which optionally has a protective layer having oxygen barrier properties, attains excellent productivity, can be developed easily, and can give a printing plate having desirable printing performances because of its advantages of high resolution and satisfactory ink receptivity.

Organic polymers developable with an alkali have hitherto been used as the polymeric binders serving as components of photosensitive layers. Examples thereof include the methacrylic acid copolymers, acrylic acid copolymers, itaconic acid copolymers, crotonic acid copolymers, maleic acid copolymers, and partially esterified maleic acid copolymers shown in, e.g., Japanese Patent Laid-Open No. 44615/1984, Japanese Patent Publication Nos. 34327/1979, 12577/1983, and 25957/1979, and Japanese Patent Laid-Open Nos. 92723/1979, 53836/1984, and 71048/1984.

However, the negative photosensitive lithographic printing plates having a photosensitive layer containing such a conventional polymeric binder have had the following problem. When the speed of scanning is increased in order to further heighten productivity, the exposed areas come not to be sufficiently cured because the exposure light energy applied thereto per unit area becomes lower accordingly. As a result, the image areas are damaged during development by the alkali ingredient contained in the developing solution, so that high press life cannot be obtained. Consequently, a further improvement in productivity has been difficult.

On the other hand, photosensitive compositions containing a modified poly(vinyl alcohol) resin having radical-polymerizable pendant groups grafted to the polymer backbone are described in Japanese Patent Laid-Open No. 2000-181062 and International Patent Publication No. 2000-506282. However, these compositions are not intended to be used for producing lithographic printing plates. Furthermore, since these photosensitive compositions take advantage of the water solubility inherent in poly(vinyl alcohol) so as to be developed with water, they have had the following problem when used as a binder for lithographic printing plates. As the content of the radical-polymerizable groups incorporated, which are effective in improving press life, is increased, the content of hydroxyl groups, which impart developability, becomes low in proportion thereto, resulting in impaired developability. Namely, it has been difficult to attain both high press life and developability.

SUMMARY OF THE INVENTION

Accordingly, an object of the invention is to eliminate the above-described drawbacks of the conventional art and to provide a negative photosensitive lithographic printing plate, especially one suitable for drawing with a laser beam, from which a lithographic printing plate having sufficient press life can be obtained with high productivity without impairing developability even under such exposure conditions that the irradiation energy per unit area is low.

The present inventors made intensive investigations in order to accomplish the object. As a result, it has been found that when a modified poly(vinyl alcohol) resin having a radical-polymerizable group and an acid group is used as a polymeric binder serving as a component of a photosensitive layer, then the object is accomplished.

(1) A negative photosensitive lithographic printing plate comprising:
 a support; and
 a photosensitive layer containing:
  a modified poly(vinyl alcohol) resin binder having a radical-polymerizable group and an acid group; and
  at least one of a photo-polymerization initiator and a heat-polymerization initiator.

(2) The negative photosensitive lithographic printing plate as described in item (1), wherein the modified poly (vinyl alcohol) resin binder contains: at least one of repeating units represented by formulae (I) and (II); and at least one of repeating units represented by formula (III):

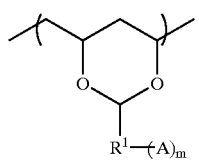 (I)

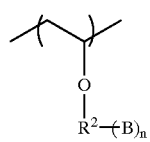 (II)

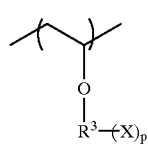 (III)

wherein A and B each independently represents a radical-polymerizable group; X represents an acid group; $R^1$, $R^2$ and $R^3$ each independently represents a substituted or unsubstituted hydrocarbon group having 1 to 30 carbon atoms, and $R^1$, $R^2$ and $R^3$ each has a valent of (m+1), (n+1) and (p+1) respectively; and m, n, and p each independently represents an integer of 1 to 5.

(3) The negative photosensitive lithographic printing plate as described in item (1), wherein the radical-polymerizable group has an addition-polymerizable unsaturated bond.

(4) The negative photosensitive lithographic printing plate as described in item (1), wherein the radical-polymerizable group has at least one selected from the group consisting of a (meth)acryloyl group, (meth)acrylamide group, allyl group and styrene structure.

(5) The negative photosensitive lithographic printing plate as described in item (1), wherein the acid group has an acid dissociation constant: $pK_a$ of 7 or lower.

(6) The negative photosensitive lithographic printing plate as described in item (1), wherein the acid group is selected from the group consisting of —COOH, —$SO_3H$, —$OSO_3H$, —$PO_3H_2$, —$OPO_3H_2$, —$CONHSO_2$— and —$SO_2NHSO_2$—.

(7) The negative photosensitive lithographic printing plate as described in item (1), wherein the acid group is —COOH.

(8) The negative photosensitive lithographic printing plate as described in item (2), wherein the repeating unit represented by formula (III) is represented by formula (IV):

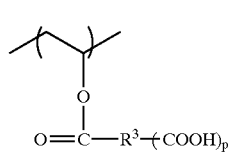 (IV)

wherein $R^3$ represents a substituted or unsubstituted hydrocarbon group having 1 to 30 carbon atoms, and $R^3$ has a valent of (p+1); and p represents an integer of 1 to 5.

(9) The negative photosensitive lithographic printing plate as described in item (8), wherein $R^3$ in the formula (IV) contains at least one of an aliphatic ring structure and an aromatic ring structure.

(10) The negative photosensitive lithographic printing plate as described in item (8), wherein $R^3$ in the formula (IV) contains an aliphatic ring structure.

(11) The negative photosensitive lithographic printing plate as described in item (2), wherein the modified poly (vinyl alcohol) resin binder contains:

i) at least one of the repeating units represented by formulae (I) and (II) in an amount of from 1 to 99% by mole; and ii) at least one of repeating units represented by formula (III) in an amount of from 1 to 70% by mole, in which the sum of the repeating unit i) and the repeating unit ii) is 2 to 100% by mole.

(12) The negative photosensitive lithographic printing plate as described in item (1), wherein the photosensitive layer further contains a compound having at least one ethylenically unsaturated bond capable of undergoing an addition polymerization.

One of the features of the negative (negative working) photosensitive lithographic printing plate of the invention resides in that a modified poly(vinyl alcohol) resin having a radical-polymerizable group and an acid group is used as a polymeric binder. Due to the use of this resin, the negative photosensitive lithographic printing plate of the invention can give a printing plate having sufficient press life with high productivity without impairing developability even under such exposure conditions that the irradiation energy per unit area is low.

Although the reasons for this effect of the invention have not been elucidated, the following may be thought. Besides having high mechanical strength, the modified poly(vinyl alcohol) resin is more apt to be crosslinked to cure in exposed areas due to the incorporation of radical-polymerizable groups. As a result, sufficient press life can be obtained even in regions exposed at a low energy. Furthermore, due to the acid groups incorporated simultaneously, the unexposed areas have excellent removability by alkali development. Thus, an excellent printing plate which combines excellent productivity and press life can be obtained without impairing developability.

DETAILED DESCRIPTION OF THE INVENTION

The photosensitive layer in the negative photosensitive lithographic printing plate of the invention will be explained below in detail.

[Polymeric Binder]

The polymeric binder, which is characteristic of the invention, is explained first.

The polymeric binder used in the photosensitive layer in the negative photosensitive lithographic printing plate of the invention comprises a modified poly(vinyl alcohol) resin having a radical-polymerizable group and an acid group. The modified poly(vinyl alcohol) resin having a radical-polymerizable group and an acid group is preferably a modified poly(vinyl alcohol) resin having: a repeating unit containing at least one of radical-polymerizable groups represented by formula (I) and (II); and a repeating unit containing at least one of acid groups represented by formula (III):

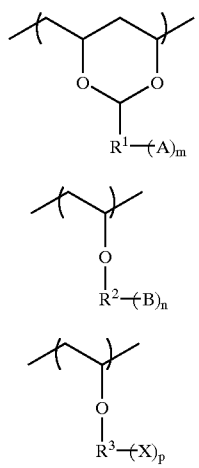

(wherein A and B each independently represent a radical-polymerizable group; X represents an acid group; $R^1$, $R^2$, and $R^3$ independently represent optionally substituted hydrocarbon groups each having 1 to 30 carbon atoms and respectively having valences of (m+1), (n+1), and (p+1); and m, n, and p each independently represent an integer of 1 to 5).

Examples of the radical-polymerizable groups represented by A and B include addition-polymerizable unsaturated bonds (e.g., (meth)acryloyl group, (meth)acrylamide group, (meth)acrylonitrile group, allyl group, styrene structure, vinyl ether structure, and acetylene structure), —SH, —PH, —SiH, —GeH, and a disulfide structure. Preferred from the standpoint of press life are addition-polymerizable unsaturated bonds. More preferred of these are a (meth)acryloyl group, (meth)acrylamide group, allyl group, and styrene structure. The term: "(meth)acryloyl group" herein means an acryloyl group or a methacryloyl group.

The acid group represented by X is not particularly limited. However, it is preferably an acid group having an acid dissociation constant (p$K_a$) of 7 or lower. The acid group is more preferably —COOH, —SO$_3$H, —OSO$_3$H, —PO$_3$H$_2$, —OPO$_3$H$_2$, —CONHSO$_2$—, or —SO$_2$NHSO$_2$—, and is most preferably —COOH.

Examples of the optionally substituted hydrocarbon groups represented by $R^1$, $R^2$, and $R^3$, which each have 1 to 30 carbon atoms and respectively have valences of (m+1), (n+1), and (p+1), include hydrocarbon groups respectively having valences of (m+1), (n+1), and (p+1), formed from the following hydrocarbons, which may have one or more substituents, by removing (m+1), (n+1), and (p+1) of the hydrogen atoms (including the hydrogen atoms on the substituents) from the following hydrocarbons.

Examples of the hydrocarbons include aliphatic hydrocarbons having 1 to 30 carbon atoms, such as methane, ethane, propane, butane, hexane, nonane, decane, octadecane, cyclopentane, cyclohexane, adamantane, norbornane, decahydronaphthalene, tricyclo[5.2.1.0$^{2,6}$] decane, ethylene, propylene, 1-butene, 1-hexene, 1-heptadecene, 2-butene, 2-hexene, 4-nonene, 7-tetradecene, butadiene, piperylene, 1,9-decadiene, cyclopentene, cyclohexene, cyclooctene, 1,4-cyclohexadiene, 1,5-cyclooctadiene, 1,5,9-cyclododecatriene, norbornylene, octahydronaphthalene, bicyclo[2.2.]hepta-2,5-diene, acetylene, 1-propyne, and 2-hexyne, and aromatichydrocarbons such as benzene, naphthalene, anthracene, indene, and fluorene.

In each of such hydrocarbon groups, one or more of the carbon atoms constituting the group may have been replaced with heteroatoms selected from oxygen, nitrogen, and sulfur atoms.

Examples of the substituents include monovalent atoms of nonmetallic elements excluding hydrogen and monovalent groups of atoms of nonmetallic elements. Specific examples thereof include halogen atoms (—F, —Br, —Cl, and —I), hydroxyl, alkoxy groups, aryloxy groups, mercapto, alkylthio groups, arylthio groups, alkyldithio groups, aryldithio groups, amino, N-alkylamino groups, N,N-dialkylamino groups, N-arylamino groups, N,N-diarylamino groups, N-alkyl-N-arylamino groups, acyloxy groups, carbamoyloxy, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, ureido, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, formyl, acyl groups, carboxyl and its conjugate base group, alkoxycarbonyl groups, aryloxycarbonyl groups, carbamoyl, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, sulfo (—SO$_3$H) and its conjugate base group, alkoxysulfonyl groups, aryloxysulfonyl groups, sulfinamoyl, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, sulfamoyl, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and their conjugate base groups, N-alkylsulfonylsulfamoyl groups (—SO$_2$NHSO$_2$ (alkyl)) and their conjugate base groups, N-arylsulfonylsulfamoyl groups (—SO$_2$NHSO$_2$ (aryl)) and their conjugate base groups, N-alkylsulfonylcarbamoyl groups (—CONHSO$_2$ (alkyl)) and their conjugate base groups, N-arylsulfonylcarbamoyl groups (—CONHSO₂ (aryl)) and their conjugate base groups, alkoxysilyl groups (—Si(O-alkyl)₃), aryloxysilyl groups (—Si(O-aryl)₃), hydroxysilyl (—Si(OH)₃) and its conjugate base group, phosphono (—PO₃H₂) and its conjugate base group, dialkylphosphono groups (—PO₃(alkyl)₂), diarylphosphono groups (—PO₃(aryl)₂), alkylarylphosphono groups (—PO₃(alkyl)(aryl)), monoalkylphosphono groups (—PO₃H(alkyl)) and their conjugate base groups, monoarylphosphono groups (—PO₃H(aryl)) and their conjugate base groups, phosphonooxy (—OPO₃H₂) and its conjugate base group, dialkylphosphonooxy groups (—OPO₃(alkyl)₂), diarylphosphonooxy groups (—OPO₃(aryl)₂), alkylarylphosphonooxy groups (—OPO₃(alkyl) (aryl)), monoalkylphosphonooxy groups (—OPO₃H(alkyl)) and their conjugate base groups, monoarylphosphonooxy groups (—OPO₃H(aryl)) and their conjugate base groups, cyano, nitro, dialkylboryl groups (—B(alkyl)₂), diarylboryl groups (—B(aryl)₂), alkylarylboryl groups (—B(alkyl)(aryl)), dihydroxyboryl (—B(OH)₂) and its conjugate base group, alkylhydroxyboryl groups (—B(alkyl)(OH)) and their conjugate base groups, arylhydroxyboryl groups (—B(aryl)(OH)) and their conjugate base groups, aryl groups, alkyl groups, alkenyl groups, and alkynyl groups.

These substituents may be bonded to each other or to the substituted hydrocarbon group to form a ring. The substituents may be further substituted.

Preferred examples of the substituents include halogen atoms, alkoxy groups, aryloxy groups, alkyl groups, alkenyl groups, alkynyl groups, and aryl groups.

The repeating units represented by formulae (I) and (II), which contain one or more radical-polymerizable groups, can be incorporated by subjecting a compound having both a hydroxyl-reactive functional group and a group capable of undergoing a radical reaction and a poly(vinyl alcohol) resin to a polymer reaction. Examples of the hydroxyl-reactive group include an aldehyde group, which undergoes an acetalization reaction, an epoxy group, which undergoes a ring-opening reaction, an isocyanate group, which undergoes a urethane-forming reaction, and a carboxylic acid, acid halide, or acid anhydride, which undergoes an esterification reaction.

Examples of such a compound having both a hydroxyl-reactive functional group and a group capable of undergoing a radical reaction include the aldehydes shown in Japanese Patent Laid-Open No. 2000-181062 and International Patent Publication No. 2000-506282, glycidyl (meth)acrylate, (meth)acryloylisocyanates, (meth)acryloyloxyethyl isocyanate, (meth)acrylic acid, (meth)acrylic anhydride, (meth)acryloyl chloride, and the following compounds.

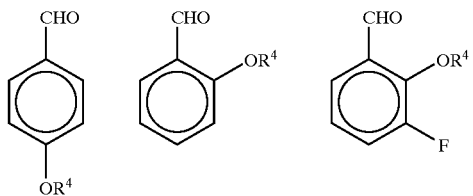

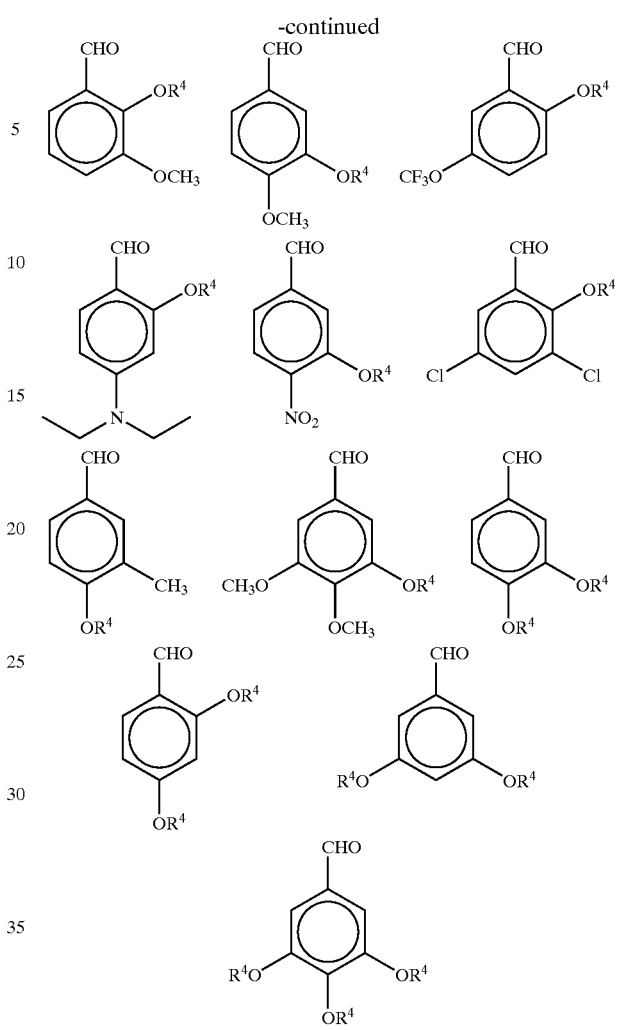

R⁴:

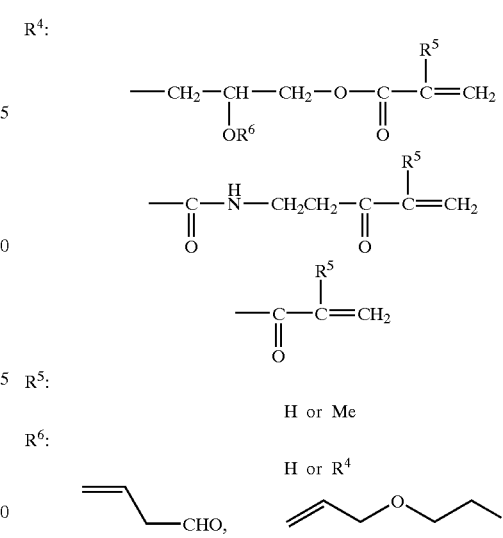

R⁵: H or Me

R⁶: H or R⁴

Preferred of the repeating units represented by formulae (I) and (II), which contain one or more radical-polymerizable groups, are repeating unit represented by formula (I) which have a structure formed from an aldehyde through acetalization, because these repeating units bring about high press life.

The binder polymer may contain one kind or two or more kinds of repeating units represented by formula (I) and/or (II), which contain one or more radical-polymerizable groups.

The total content of the repeating units represented by formula (I) and/or (II), which contain one or more radical-polymerizable groups, in the modified poly(vinyl alcohol) resin is suitably determined according to the structure of the resin, design of the photosensitive layer, properties of the developing solution to be used, etc. However, from the standpoint of press life, the total content thereof is preferably from 1 to 99% by mole, more preferably from 5 to 90% by mole, even more preferably from 10 to 80% by mole, most preferably from 20 to 70% by mole.

Especially preferred of the repeating units represented by formula (III), which contain one or more acid groups, are repeating units represented by formula (IV), because the modified poly(vinyl alcohol) resin having these repeating units is easy to synthesis. The repeating units represented by formula (IV) can be incorporated by subjecting an anhydride represented by the following formula (V) and a poly(vinyl alcohol) resin to a polymer reaction.

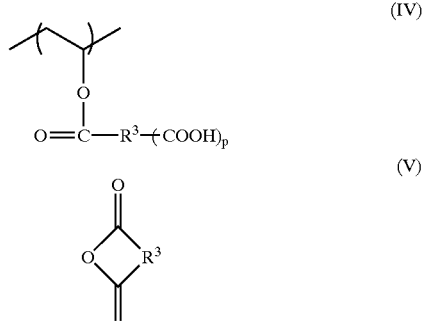

(In formulae (IV) and (V), $R^3$ is the same as in formula (III).)

Examples of the acid anhydride include succinic anhydride, methylsuccinic anhydride, isobutynylsuccinic anhydride, 2-octen-1-ylsuccinic anhydride, S-acetylmercaptosuccinic anhydride, phenylsuccinic anhydride, itaconic anhydride, diacetyltartaric anhydride, maleic anhydride, citraconic anhydride, bromomaleic anhydride, dichloromaleic anhydride, phenylmaleic anhydride, aconitic anhydride, glutaric anhydride, 3-ethyl-3-methylglutaric anhydride, 3,3-tetramethyleneglutaric anhydride, hexafluoroglutaric anhydride, 2-phenylglutaric anhydride, 3,5-diacetyltetrahydropyran-2,4,6-trione, diglycolic anhydride, 3-oxabicyclo[3.1.0]hexane-2,4-dione, cyclohexanedicarboxylic anhydride, hexahydro-4-methylphthalic anhydride, 1,2,3,6-tetrahydrophthalic anhydride, 3,4,6-tetrahydrophthalic anhydride, 5-norbornene-2,3-dicarboxylic anhydride, bicyclo[2.2.2]oct-5-ene-2,3-dicarboxylic anhydride, cantharidin, 3,6-epoxy-1,2,3,6-tetrahydrophthalic anhydride, 1-cyclopentene-1,2-dicarboxylic anhydride, 1,4,5,6,7,7-hexachloro-5-norbornene-2,3-dicarboxylic anhydride, phthalic anhydride, isatic anhydride, homophthalic anhydride, 4-methylphthalic anhydride, 3,6-difluorophthalicanhydride, 3-hydroxyphthalicanhydride, 1,2,4-benzenetricarboxylic anhydride, 3-nitrophthalic anhydride, diphenic anhydride, 1,8-naphthalic anhydride, 4-aminonaphthalic anhydride, and 4-amino-3,6-disulfo-1,8-naphthalic anhydride dipotassium salt.

From the standpoint of press life, $R^3$ is preferably a group having an aliphatic or aromatic ring structure, especially a group having an aliphatic ring structure.

The binder polymer may contain one kind or two or more kinds of repeating units represented by formula (IV), which have one or more carboxyl groups.

The total content of the repeating units represented by formula (IV), which contain one or more carboxyl groups, in the modified poly(vinyl alcohol) resin is suitably determined according to the structure of the resin, design of the photosensitive layer, properties of the developing solution to be used, etc. However, from the standpoint of press life, the total content thereof is preferably from 1 to 70% by mole, more preferably from 5 to 60% by mole, most preferably from 10 to 50% by mole.

Preferred examples of the units represented by formulae (I), (II), and (IV) are shown below, but they should not be construed as limiting the scope of the invention.

EXAMPLES OF FORMULA (I)

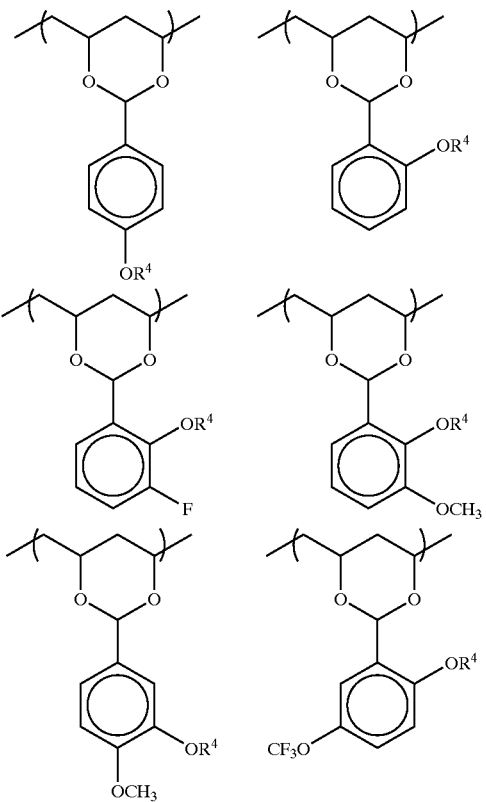

-continued
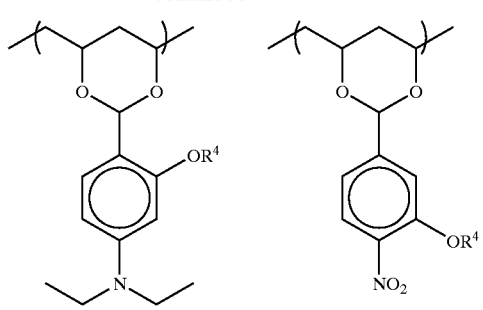
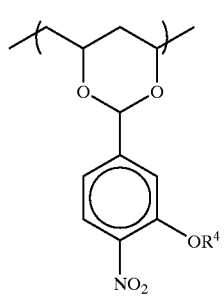
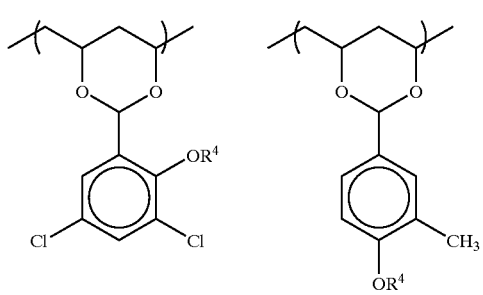
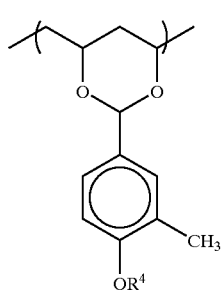
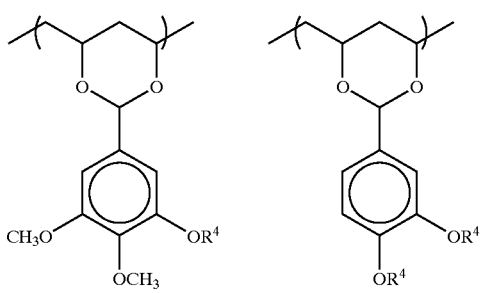
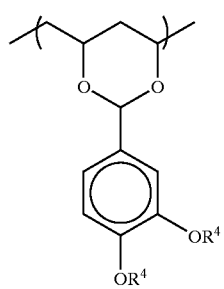
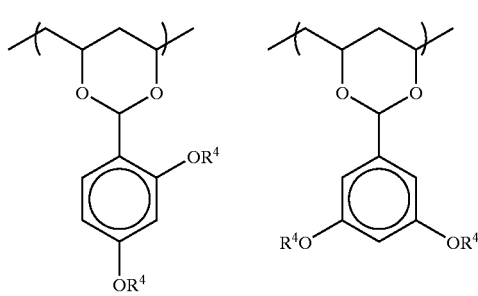
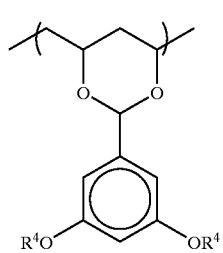
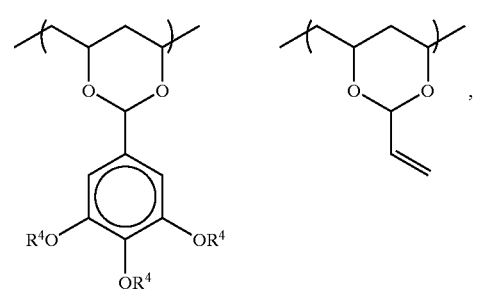
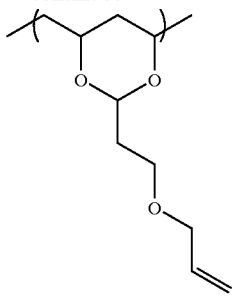
EXAMPLES OF FORMULA (II)
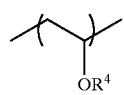
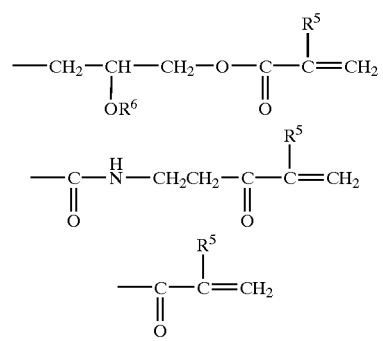
$R^5$: H or Me
$R^6$: H or $R^4$
EXAMPLES OF FORMULA (IV)
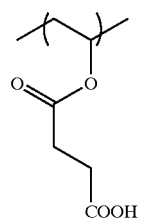
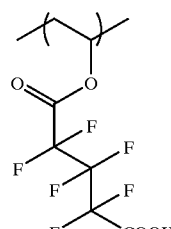
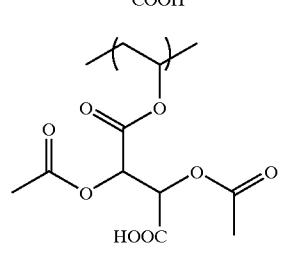

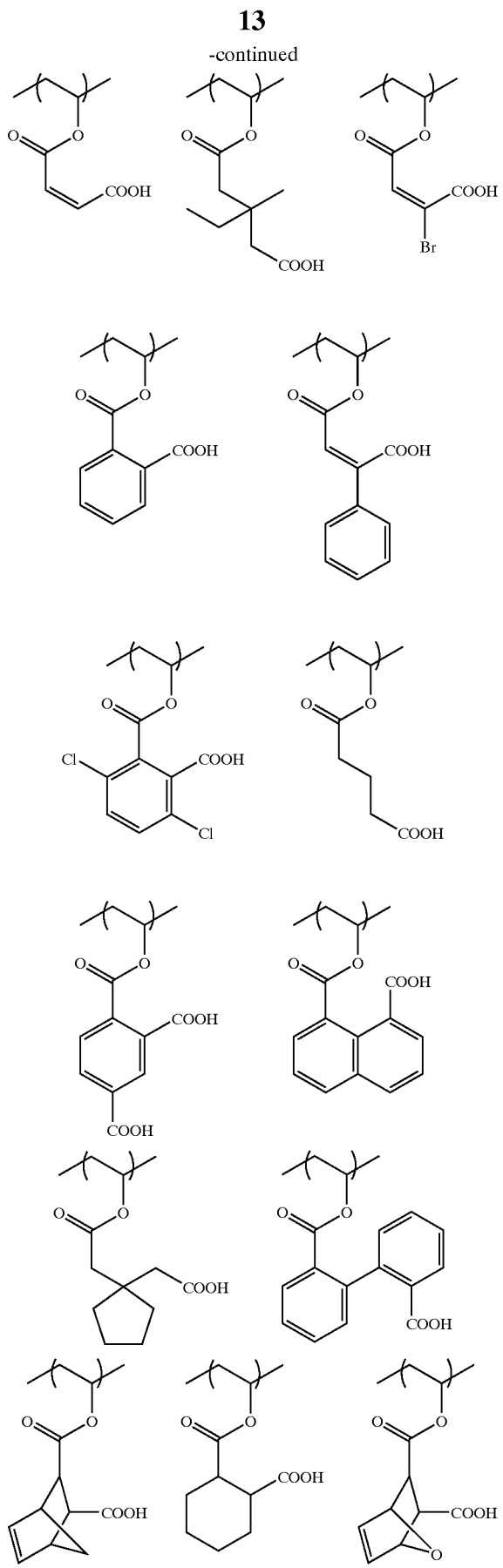
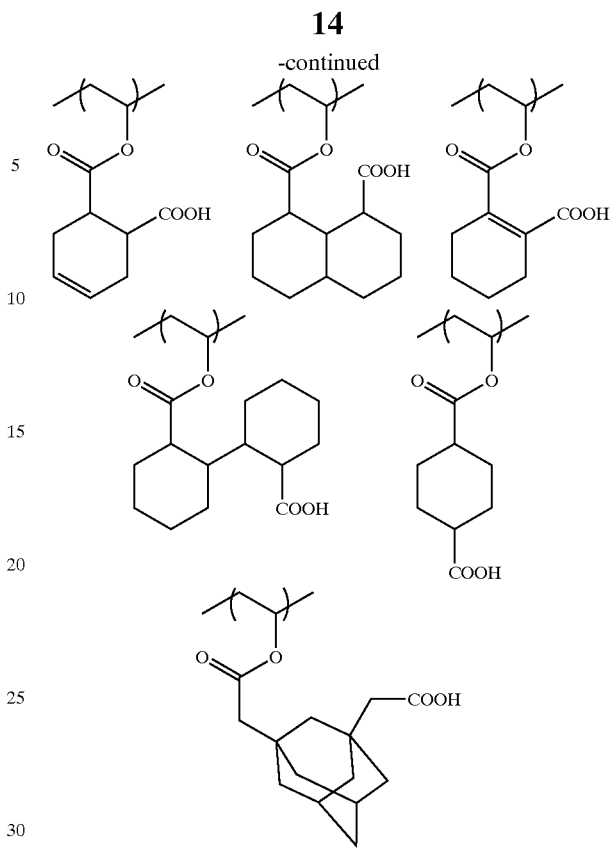

Although the modified poly(vinyl alcohol) resin to be used in the invention may be one in which all the hydroxyl groups have been modified, it usually contains vinyl alcohol repeating units remaining unreacted. From the standpoint of press life, the content of vinyl alcohol repeating units is generally from 0 to 90% by mole, preferably from 0 to 60% by mole, more preferably from 0 to 40% by mole.

The modified poly(vinyl alcohol) resin can contain vinyl acetate repeating units depending on the degree of saponification of the poly(vinyl alcohol) used as a starting material. The content of vinyl acetate repeating units is preferably from 0 to 50% by mole, more preferably from 0 to 40% by mole, most preferably from 0 to 30% by mole, from the standpoint of ease of incorporation of units represented by formulae (I), (II), and (III). The modified poly(vinyl alcohol) resin may be a copolymer with vinylpyrrolidone or the like.

The modified poly(vinyl alcohol) resin binder in the invention is most preferably one which contains at least one of repeating units represented by formula (I) and at least one of repeating units represented by formula (IV).

The molecular weight of the modified poly(vinyl alcohol) resin binder in the invention is suitably determined from the standpoints of image-forming properties and press life. In general, higher molecular weights bring about better press life but tend to result in impaired image-forming properties. Conversely, lower molecular weights bring about improved image-forming properties but reduce press life. The molecular weight thereof is preferably from 2,000 to 1,000,000, more preferably from 5,000 to 500,000, most preferably from 10,000 to 200,000.

The negative photosensitive lithographic printing plate in the invention may use one kind of the modified poly(vinyl alcohol) resin binder, or may use in combination of two or more kinds thereof. Furthermore, a mixture of this binder and one or more known polymeric binders may be used. In the case of using such a mixture, known polymeric binders may be added in an amount generally from 1 to 60% by weight, preferably from 1 to 40% by weight, more preferably from 1 to 20% by weight, based on the total amount of all polymeric binders used. Known polymeric binders can be used as such optional polymeric binders without particular limitations. Preferred examples thereof include binders frequently used in the art, such as binders having an acrylic main chain, urethane binders, and acetal-modified poly (vinyl alcohol) resins (e.g., butyral resins).

Although the total amount of the modified poly(vinyl alcohol) resin binder and one or more optional polymeric binders in the photosensitive layer can be suitably determined, it is generally from 10 to 90% by weight, preferably from 20 to 80% by weight, more preferably from 30 to 70% by weight, based on the total amount of all nonvolatile ingredients in the photosensitive layer.

[Photo- or Heat-Polymerization Initiator]

As the photopolymerization initiator, various known photopolymerization initiators shown in patent and other documents, or a combination of two or more of these (photopolymerization initiator system) can be suitably selected according to the wavelength for the light source to be used.

Various photopolymerization initiators (initiator systems) have been proposed for use in the case of using a blue semiconductor laser, an Ar laser, the second higher harmonic of an infrared semiconductor laser, or an SHG-YAG laser as a light source. Examples thereof include the photo reducible dyes of some kind shown in, e.g., U.S. Pat. No. 2,850,445, such as Rose Bengal, Eosin, and erythrocine; a system comprising a combination of a dye and an initiator, e.g., a combination of a dye and an amine (see Japanese Patent Publication No. 20189/1969); a system comprising a combination of a hexaarylbiimidazole, a radical generator, and a dye (see Japanese Patent Publication No. 37377/1970); a system comprising a hexaarylbiimidazole and a p-dialkylaminobenzylidene ketone (see Japanese Patent Publication No. 2528/1972 and Japanese Patent Laid-Open No. 155292/1979); a system comprising a cyclic cis-α-dicarbonyl compound and a dye (see Japanese Patent Laid-Open No. 84183/1973); a system comprising a cyclic triazine and a merocyanine dye (see Japanese Patent Laid-Open No. 151024/1979); a system comprising 3-ketocoumarin and an activator (see Japanese Patent Laid-Open Nos. 112681/1977 and 15503/1983); a system comprising biimidazole, a styrene derivative, and a thiol (see Japanese Patent Laid-Open No. 140203/1984); a system comprising an organic peroxide and a dye (see Japanese Patent Laid-Open Nos. 1504/1984, 140203/1984, 189340/1984, and 174203/1987, Japanese Patent Publication No. 1641/1987, and U.S. Pat. No. 4,766,055); a system comprising a dye and an active halogen compound (see Japanese Patent Laid-Open Nos. 1718105/1988, 258903/1988, and 264771/1991); a system comprising a dye and a borate compound (see Japanese Patent Laid-Open Nos. 143044/1987, 150242/1987, 13140/1989, 13141/1989, 13142/1989, 13143/1989, 13144/1989, 17048/1989, 229003/1989, 298348/1989, and 138204/1989); a system comprising a dye having a rhodanine ring and a radical generator (see Japanese Patent Laid-Open Nos. 179643/1990 and 244050/1990); a system comprising a titanocene and a 3-ketocoumarin dye (see Japanese Patent Laid-Open No. 221110/1988); a system comprising a combination of a titanocene, a xanthene dye, and an addition-polymerizable ethylenically unsaturated compound containing an amino or urethane group (see Japanese Patent Laid-Open Nos. 221958/1992 and 219756/1992); a system comprising a titanocene and a specific merocyanine dye (see Japanese Patent Laid-Open No. 295061/1994); and a system comprising a titanocene and a dye having a benzopyran ring (see Japanese Patent Laid-Open No. 334897/1996).

Especially preferred photopolymerization initiators (initiator systems) in the photosensitive layer in the negative photosensitive lithographic printing plate of the invention contain at least one titanocene.

Any titanocene compound may be used in the photopolymerization initiator (initiator system) in the invention as long as the titanocene compound is capable of generating an active radical upon irradiation with a light in the presence of a sensitizing dye. One or more titanocene compounds to be used in the invention may be suitably selected from the known titanocene compounds described in, e.g., Japanese Patent Laid-Open Nos. 152396/1984, 151197/1986, 41483/1988, 41484/1988, 249/1990, 291/1990, 27393/1991, 12403/1991, and 41170/1994.

Specific examples of the titanocene compounds include dicyclopentadienyltitanium dichloride, dicyclopentadienyltitanium-bisphenyl, dicyclopentadienyltitanium-bis-2,3,4,5,6-pentafluorophen-1-yl (hereinafter referred to also as "T-1"), dicyclopentadienyltitanium-bis-2,3,5,6-tetrafluorophen-1-yl, dicyclopentadienyltitanium-bis-2,4,6-trifluorophen-1-yl, dicyclopentadienyltitanium-bis-2,6-difluorophen-1-yl, dicyclopentadienyltitanium-bis-2,4-difluorophen-1-yl, dimethylcyclopentadienyltitanium-bis-2,3,4,5,6-pentafluorophen-1-yl, dimethylcyclopentadienyltitanium-bis-2,3,5,6-tetrafluorophen-1-yl, dimethylcyclopentadienyltitanium-bis-2,4-difluorophen-1-yl, and bis(cyclopentadienyl)bis(2,6-difluoro-3-(pyr-1-yl)phenyl)titanium (hereinafter referred to also as "T-2").

Those titanocene compounds can be chemically modified in various ways in order to improve the properties of the photosensitive layer. Examples of usable modification techniques include bonding to a radical-generating part of, e.g., a sensitizing dye or addition-polymerizable unsaturated compound, incorporation of a hydrophilic group, improvement of compatibility, incorporation of a substituent for inhibiting crystal precipitation, incorporation of a substituent for improving adhesion, and conversion into a polymer.

Methods for using those titanocene compounds also can be suitably determined without particular limitations according to the performance design of the negative photosensitive lithographic printing plate, as in the case of the addition-polymerizable compounds described above. For example, a titanocene compound can have enhanced compatibility in the photosensitive layer when used in combination with one or more other titanocene compounds. Larger amounts of the photopolymerization initiators to be used, including the titanocene compounds, are usually advantageous from the standpoint of photosensitivity. Sufficient photosensitivity is obtained when a photopolymerization initiator is used in an amount of generally from 0.5 to 80 parts by weight, preferably from 1 to 50 parts by weight, per 100 parts by weight of the nonvolatile ingredients in the photosensitive layer. On the other hand, smaller titanocene amounts are preferred from the standpoint of diminishing the blurring caused by a light of around 500 nm as a result of the use of yellow or white light or the like; these light are for a major purpose of the invention. Even when the amount of one or more titanocene compounds is reduced to 6 parts by weight or smaller, especially to 1.9 parts by weight or smaller, and further to 1.4 parts by weight or smaller, sufficient photosensitivity can be obtained by using the titanocene compounds in combination with the other sensitizing dye.

In the case where a laser which emits infrared rays having a wavelength of from 760 to 1,200 nm is to be used as a light source, it is generally indispensable to use an infrared absorber. Infrared absorbers function to absorb infrared rays and convert them into heat. A radical generator is pyrolyzed by the resultant heat to generate a radical. The infrared absorber to be used in the invention is a dye or pigment having an absorption maximum in the wavelength range of from 760 to 1,200 nm.

As the dye can be used commercial dyes and other known dyes shown in the literature, e.g., Senryô Binran (edited by Japan Society of Organic Synthesis Chemistry, published in 1970). Examples of the dyes include azo dyes, metal complex azo dyes, pyrazolone azo dyes, naphthoquinone dyes, anthraquinone dyes, phthalocyanine dyes, carbonium dyes, qunoneimine dyes, methine dyes, cyanine dyes, squarylium dyes, pyrylium salts, and metal thiolate complexes.

Preferred examples of the dyes include the cyanine dyes described in, e.g., Japanese Patent Laid-Open Nos. 125246/1983, 84356/1984, 202829/1984, and 78787/1985; the methine dyes described in, e.g., Japanese Patent Laid-Open Nos. 173696/1983, 181690/1983, and 194595/1983; the naphthoquinone dyes described in, e.g., Japanese Patent Laid-Open Nos. 112793/1983, 224793/1983, 48187/1984, 73996/1984, 52940/1985, and 63744/1985; the squarylium dyes described in, e.g., Japanese Patent Laid-Open No. 112792/1983; and the cyanine dyes described in British Patent 434,875.

Other preferred examples thereof include the near-infrared-absorbing sensitizer described in U.S. Pat. No. 5,156,938; the substituted arylbenzo(thio)pyrylium salts described in U.S. Pat. No. 3,881,924; the trimethine thiapyrylium salts described in Japanese Patent Laid-Open No. 142645/1982 (U.S. Pat. No. 4,327,169); the pyrylium compounds described in Japanese Patent Laid-Open Nos. 181051/1983, 220143/1983, 41363/1984, 84248/1984, 84249/1984, 146063/1984, and 146061/1984; the cyanine dyes described in Japanese Patent Laid-Open No. 216146/1984; the pentamethine thiopyrylium salts described in U.S. Pat. No. 4,283,475; and the pyrylium compounds disclosed in Japanese Patent Publication Nos. 13514/1993 and 19702/1993.

Further preferred examples of the dyes include the near-infrared-absorbing dyes shown by formulae (I) and (II) in the specification of U.S. Pat. No. 4,756,993.

Especially preferred of those dyes are cyanine dyes, squarylium dyes, pyrylium salts, and nickel thiolate complexes. More preferred are cyanine dyes. In particular, the cyanine dyes represented by the following formula (VI) are most preferred.

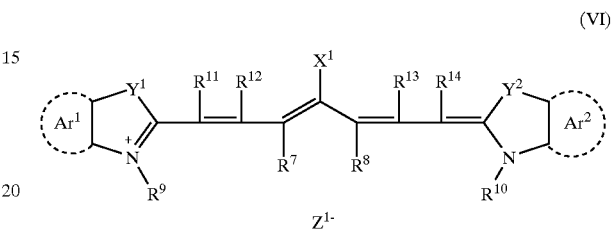

(VI)

In formula (VI), $X^1$ represents a halogen atom or $X^2$—$L^1$, wherein $X^2$ represents an oxygen atom or sulfur atom and $L^1$ represents a hydrocarbon group having 1 to 12 carbon atoms. $R^7$ and $R^8$ each independently represent a hydrocarbon group having 1 to 12 carbon atoms. From the standpoint of the storage stability of a coating fluid for photosensitive-layer formation, $R^7$ and $R^8$ preferably are hydrocarbon groups having 2 or more carbon atoms, and more preferably are bonded to each other to form a five- or six-membered ring.

$Ar^1$ and $Ar^2$ may be the same or different and each represent an aromatic hydrocarbon group which may have one or more substituents. Preferred examples of the aromatic hydrocarbon group include a benzene ring and a naphthalene ring. Preferred examples of the substituents include hydrocarbon groups having up to 12 carbon atoms, halogen atoms, and alkoxy groups having up to 12 carbon atoms. $Y^1$ and $Y^2$ may be the same or different and each represent a sulfur atom or dialkylmethylene group having up to 12 carbon atoms. $R^9$ and $R^{10}$ maybe the same or different and each represent a hydrocarbon group which has up to 20 carbon atoms and may have one or more substituents. Preferred examples of the substituents include alkoxy groups having up to 12 carbon atoms, carboxyl, and sulfo. $R^{11}$, $R^{12}$, $R^{13}$, and $R^{14}$ may be the same or different and each represent a hydrogen atom or a hydrocarbon group having up to 12 carbon atoms. From the standpoint of availability of starting materials, $R^{11}$ to $R^{14}$ are preferably hydrogen atoms. $Z^{1-}$ represents a counter anion, provided that $Z^{1-}$ need not be present when any of $R^7$ to $R^{14}$ has been substituted with a sulfo group. From the standpoint of the storage stability of a coating fluid for photosensitive-layer formation, $Z^{1-}$ is preferably a halogen ion, perchlorate ion, tetrafluoroborate ion, hexafluorophosphate ion, or sulfonate ion, and is more preferably a perchlorate ion, hexafluorophosphate ion, or arylsulfonate ion.

Specific examples of the cyanine dyes represented by formula (VI), which can be advantageously used in the invention, include those shown below. These dyes are given in the specification of Japanese Patent Application No. 310623/1999.

19 20
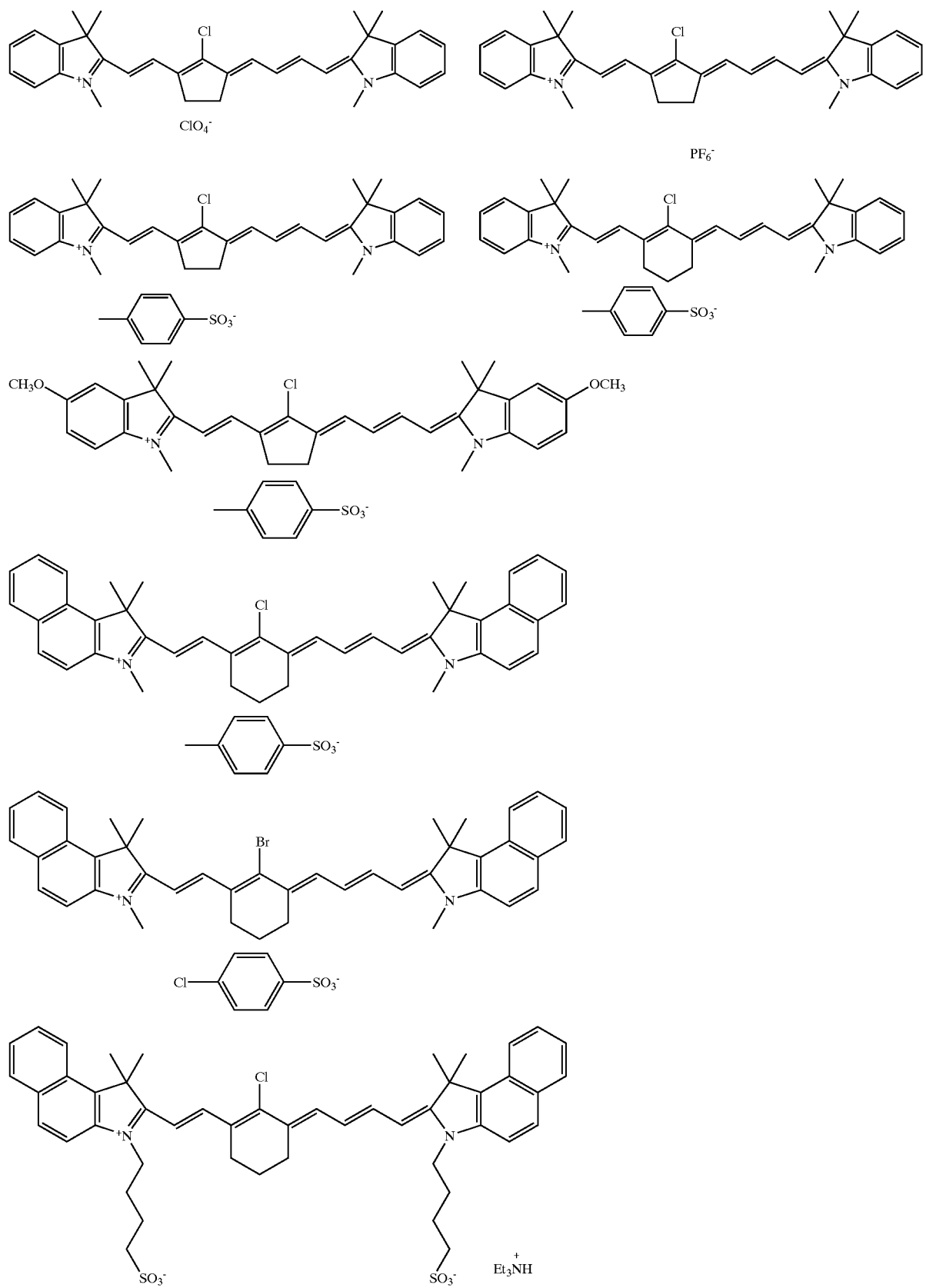

-continued

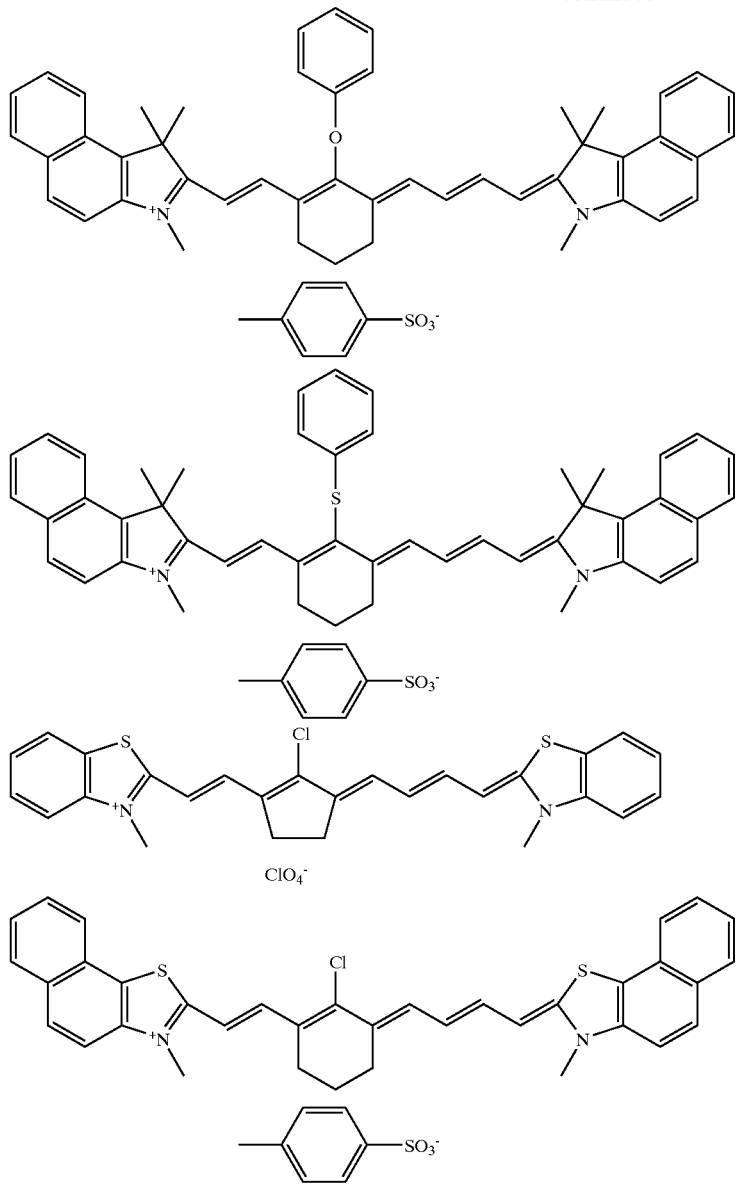

As the pigment in the invention can be used commercial pigments and pigments described in a Color Index (C.I.) handbook, Saishin Ganryô Binran (edited by Japan Society of Pigment Technology, published in 1977), Saishin Ganryô Ôyô Gijutsu (CMC Shuppan, published in 1986), and Insatsu Inki Gijutsu (CMC Shuppan, published in 1984).

Examples of the kinds of such pigments include black pigments, yellow pigments, orange pigments, brown pigments, red pigments, purple pigments, blue pigments, green pigments, fluorescent pigments, metal powder pigments, and polymer-bonded pigments. Specific examples of usable pigments include insoluble azo pigments, azo lake pigments, condensation azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Preferred of these pigments is carbon black.

Those pigments maybe used without undergoing a surface treatment, or may be used after having undergone a surface treatment. Possible methods for surface treatment include a technique in which the surface of a pigment is coated with a resin or wax, a technique in which a surfactant is adhered to the surface of a pigment, and a technique in which a reactive substance (e.g., a silane coupling agent, epoxy compound, or polyisocyanate) is bonded to the surface of a pigment. These methods for surface treatment are described in Kinzoku Sekken No Seishitsu To Ôyô (Saiwai Shobo), Insatsu Inki Gijutsu (CMC Shuppan, published in 1984), and Saishin Ganryô Ôyô Gijutsu (CMC Shuppan, published in 1986).

The particle diameter of the pigment is preferably from 0.01 to 10 μm, more preferably from 0.05 to 1 μm, most preferably from 0.1 to 1 μm. Use of a pigment having a particle diameter smaller than 0.01 μm is undesirable in that the pigment dispersion shows poor stability in a coating fluid for forming an image-forming photosensitive layer. On the other hand, use of a pigment having a particle diameter exceeding 10 μm is undesirable from the standpoint of the evenness of the image-forming photosensitive layer to be formed.

For dispersing the pigment, known dispersion techniques for the production of inks, toners, or the like can be used. Examples of usable dispersing machines include an ultrasonic disperser, sand mill, attritor, pearl mill, supermill, ball mill, impeller, disperser, KD mill, colloid mill, dynatron, three-roll mill, and pressure kneader. Details thereof are given in Saishin Ganryô Ôyô Gijutsu (CMC Shuppan, published in 1986).

Such infrared absorbers may be incorporated into either the photosensitive layer or another layer, e.g., an overcoat layer or undercoat layer. It is, however, preferred that in the negative photosensitive lithographic printing plate finally produced, the photosensitive layer should have an optical density of from 0.1 to 3.0 as measured at the wavelength corresponding to the absorption maximum thereof in the wavelength range of from 760 to 1,200 nm. Optical densities thereof outside the range tend to result in reduced sensitivity. Since the optical density of the photosensitive layer is determined by the amount of the infrared absorber added thereto and the thickness of the layer, a desired value of optical density can be obtained by regulating the two factors. The optical density of a photosensitive layer can be measured by an ordinary method. Examples of the method for measurement include: a method in which a photosensitive layer is formed by coating on a transparent or white support in such an amount as to result in a suitably predetermined dry thickness within the range required for lithographic printing plates and is then examined with a transmission type optical densitometer; and a method in which a photosensitive layer is formed on a reflective support such as an aluminum support and examined for reflection density.

As a heat-polymerization initiator, a heat-decomposable radical generator is used in combination with the infrared absorber. This radical generator means a compound which generates a radical upon irradiation with infrared laser beam. Examples of the radical generator include onium salts, triazine compounds having a trihalomethyl group, peroxides, azo polymerization initiators, azide compounds, and quinonediazide. Of these, onium salts are preferred because of their high sensitivity.

Preferred onium salts which can be advantageously used as a radical polymerization initiator in the invention are explained below. Examples of the preferred onium salts include iodonium salts, diazonium salts, and sulfonium salts. In the invention, these onium salts do not function as an acid generator but as an initiator for radical polymerization. The onium salts which can be advantageously used in the invention are represented by the following formulae (VII) to (IX).

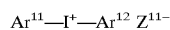   Formula (VII)

   Formula (VIII)

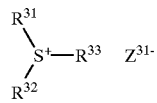   Formula (IX)

In formula (VII), $Ar^{11}$ and $Ar^{12}$ each independently represent an optionally substituted aryl group having up to 20 carbon atoms (including the carbon atoms of any substituent). In the case where this aryl group has one or more substituents, preferred examples of the substituents include halogen atoms, nitro, alkyl groups having up to 12 carbon atoms, alkoxy groups having up to 12 carbon atoms, and aryloxy groups having up to 12 carbon atoms. $Z^{11-}$ represents a counter ion selected from the group consisting of a halogen ion, perchlorate ion, tetrafluoroborate ion, hexafluorophosphate ion, and sulfonate ion, and is preferably a perchlorate ion, hexafluorophosphate ion, or arylsulfonate ion.

In formula (VIII), $Ar^{21}$ represents an optionally substituted aryl group having up to 20 carbon atoms (including the carbon atoms of any substituent). Preferred examples of the substituents include halogen atoms, nitro, alkyl groups having up to 12 carbon atoms, alkoxy groups having up to 12 carbon atoms, aryloxy groups having up to 12 carbon atoms, alkylamino groups having up to 12 carbon atoms, dialkylamino groups having up to 12 carbon atoms, arylamino groups having up to 12 carbon atoms, and diarylamino groups having up to 12 carbon atoms. $Z^{21-}$ represents a counter ion, which has the same meaning as $Z^{11-}$.

In formula (IX), $R^{31}$, $R^{32}$, and $R^{33}$ may be the same or different and each represent an optionally substituted hydrocarbon group having up to 20 carbon atoms (including the carbon atoms of any substituent). Preferred examples of the substituents include halogen atoms, nitro, alkyl groups having up to 12 carbon atoms, alkoxy groups having up to 12 carbon atoms, and aryloxy groups having up to 12 carbon atoms. $Z^{31-}$ represents a counter ion, which has the same meaning as $Z^{11-}$.

Specific examples of the onium salts advantageously usable as a radical generator in the invention include the following onium salts, which are given in the specification of Japanese Patent Application No. 310623/1999.

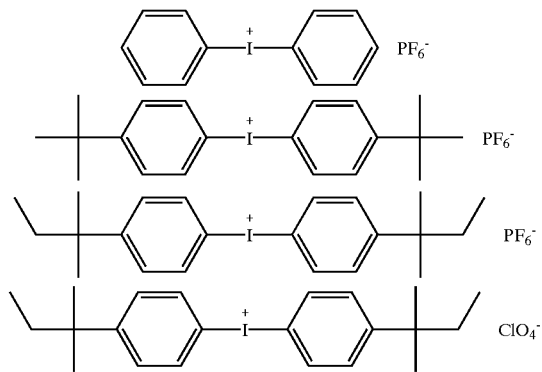

25
-continued
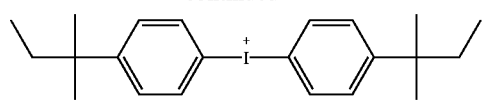
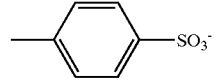
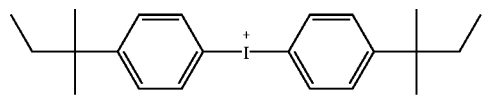
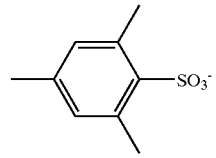
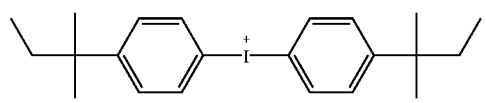
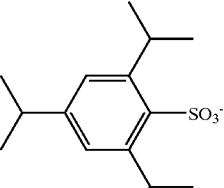
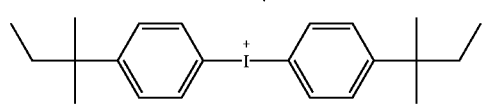
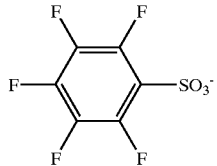
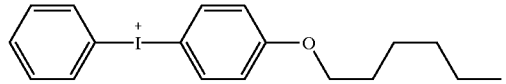
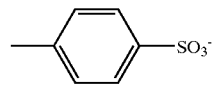
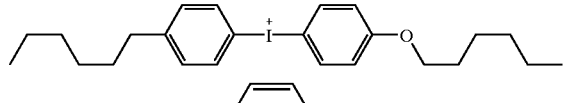
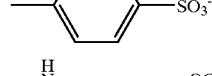
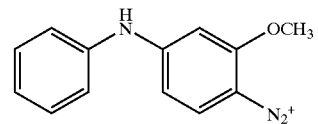
26
-continued
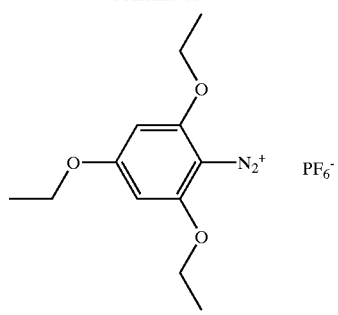
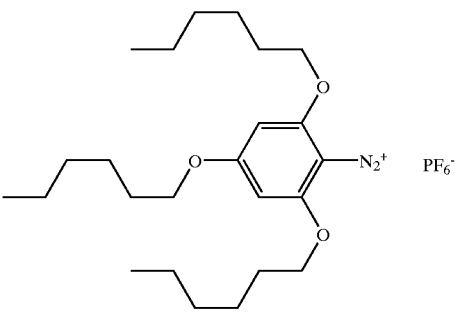
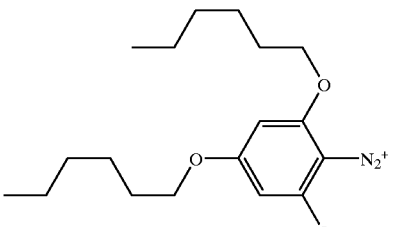
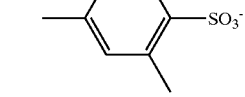
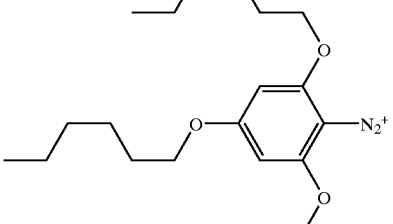
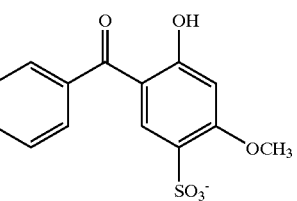

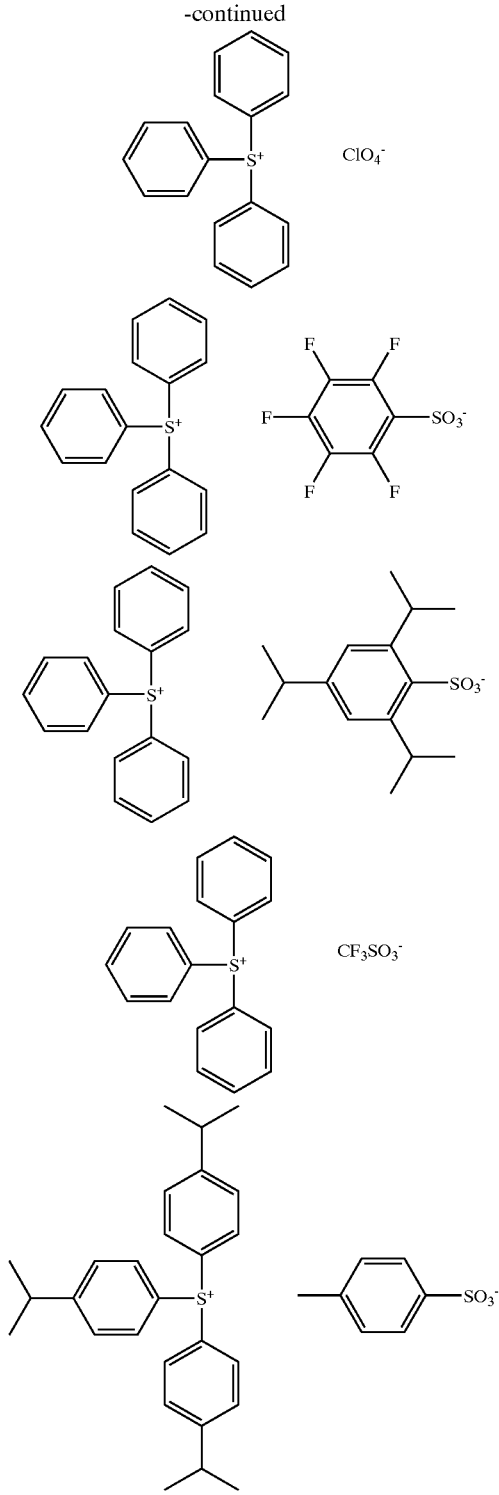

The heat-decomposable radical generators for use in the invention have a maximum absorption wavelength of preferably 400 nm or shorter, more preferably 360 nm or shorter. By using such a radical generator having an absorption wavelength within the ultraviolet region, the negative photosensitive lithographic printing plate can be handled in white light.

Those heat-decomposable radical generators can be added to a coating fluid for photosensitive-layer formation in an amount of generally from 0.1 to 50% by weight, preferably from 0.5 to 30% by weight, more preferably from 1 to 20% by weight, based on all the nonvolatile ingredients contained in the coating fluid for photosensitive-layer formation. Addition amounts thereof smaller than 0.1% by weight result in poor sensitivity, while addition amounts thereof exceeding 50% by weight result in a printing plate in which the nonimage areas are soiled during printing. Those radical generators may be used alone or in combination of two or more thereof. The heat-decomposable radical generators may be added to the same layer as other ingredients or may be added to a layer separately formed. However, it is preferred to add the radical generators to the same layer as other ingredients.

Ingredients which can be incorporated besides the polymeric binders and polymerization initiators into the photosensitive layer will be explained next.

The photosensitive layer in the negative photosensitive lithographic printing plate of the invention contains a negative type photosensitive material for image formation. As this photosensitive material, a known one can be used without particular limitations. Examples of the negative type photosensitive material include the radical-polymerizable type, the cationically polymerizable type, and the hybrid type which undergoes both radical polymerization and cationic polymerization. However, radical-polymerizable photosensitive materials are especially preferred because they have an excellent balance between sensitivity and stability.

The negative photosensitive lithographic printing plate of the invention is especially suitable for plate making through direct drawing with a laser beam having a wavelength of from 300 to 1,200 nm. The printing plate thus produced there from has higher press life than conventional lithographic printing plates.

[Photo- or Heat-Polymerizable Negative Type Photosensitive Layer]

An especially preferred photosensitive layer in the negative photosensitive lithographic printing plate of the invention is a photo- or heat-polymerizable negative type photosensitive layer comprising the modified poly(vinyl alcohol) resin binder, a photo- or heat-polymerization initiator, and a compound having at least one ethylenically unsaturated bond capable of undergoing addition polymerization (hereinafter often referred to simply as "addition-polymerizable compound"). Besides these ingredients, various additives may be incorporated into this photosensitive layer, such as a co-sensitizer, colorant, plasticizer, and polymerization inhibitor.

[Addition-Polymerizable Compound]

The addition-polymerizable compound having at least one ethylenically unsaturated double bond to be used in the photo- or heat-polymerizable negative type photosensitive layer is selected from compounds having at least one, preferably two ethylenically unsaturated terminal bonds. Such compounds are widely known in this industrial field, and can be used in the invention without particular limitations. Such compounds are in the chemical forms of, for example, monomer, prepolymers, i.e., dimer, trimer, and oligomer, and mixtures and copolymers thereof. Examples of the monomeric compounds and copolymers thereof include unsaturated carboxylic acids (e.g., acrylic acid, methacrylic acid, itaconic acid, crotonic acid, isocrotonic acid, and maleic acid) and esters and amides thereof. Preferred of these are esters of an unsaturated carboxylic acid with an aliphatic polyhydric alcohol compound and amides of an unsaturated carboxylic acid with an aliphatic polyamine compound. Also preferred are: adducts of an unsaturated carboxylic acid ester or amide having a nucleophilic substituent, e.g., a hydroxyl, amino, or mercapto group, with a mono- or polyfunctional isocyanate or epoxy; and products of the dehydrating condensation reaction of the ester or amide with a mono- or polycarboxylic acid. Preferred examples of the addition-polymerizable compound further include: adducts of an unsaturated carboxylic acid ester or amide having an electrophilic substituent, e.g., an isocyanate or epoxy group, with a mono- or polyfunctional alcohol, amine, or thiol; and products of the substitution reaction of an unsaturated carboxylic acid ester or amide having an eliminable substituent, e.g., a halogen or a tosyloxy group, with a mono- or polyfunctional alcohol, amine, or thioether. Other usable examples of the addition-polymerizable compound include compounds formed by the reactions described above wherein an unsaturated phosphonic acid, styrene, vinyl ether, or the like is used in place of the unsaturated carboxylic acid.

Specific examples of the monomeric esters of aliphatic polyhydric alcohol compounds with unsaturated carboxylic acids are as follows. Examples of the acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethanetriacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers.

Examples of the methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconic esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic esters include ethylene glycol dicrotonate, tetramethylene glycol dicrotonate, pentaerythritol dicrotonate, and sorbitol tetradicrotonate.

Examples of the isocrotonic esters include ethylene glycol diisocrotonate, pentaerythritol diisocrotonate, and sorbitol tetraisocrotonate.

Examples of the maleic esters include ethylene glycol dimaleate, triethylene glycol dimaleate, pentaerythritol dimaleate, and sorbitol tetramaleate.

Other preferred examples of the esters include the aliphatic alcohol esters shown in Japanese Patent Publication Nos. 27926/1971 and 47334/1976 and Japanese Patent Laid-Open No. 196231/1982, the esters having an aromatic framework shown in Japanese Patent Laid-Open Nos. 5240/1984, 5241/1984, and 226149/1990, and the esters having an amino group shown in Japanese Patent Laid-Open No. 165613/1989.

The ester monomers shown above may be used as a mixture of two or more thereof.

Examples of the monomeric amides of an aliphatic polyamine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Examples of other preferred amide monomers include those having a cyclohexylene structure shown in Japanese Patent Publication No. 21726/1979.

Also preferred are addition-polymerizable urethane compounds produced by the addition reaction of an isocyanate with hydroxyl groups. Examples thereof include the vinyl urethane compounds containing two or more polymerizable vinyl groups per molecule described in, e.g., Japanese Patent Publication No. 41708/1973. The vinyl urethane compounds are produced by causing a polyisocyanate compound having two or more isocyanate groups per molecule to add a hydroxyl-containing vinyl monomer represented by the following formula (X):

$$CH_2=C(R^4)COOCH_2CH(R^5)OH \quad\quad\quad (X)$$

wherein $R^4$ and $R^5$ each represent H or $CH_3$.

Other preferred addition-polymerizable urethane compounds include urethane acrylates such as those described in Japanese Patent Laid-Open No. 37193/1976 and Japanese Patent Publication Nos. 32293/1990 and 16765/1990 and the urethane compounds having an ethylene oxide backbone described in Japanese Patent Publication Nos. 49860/1983, 17654/1981, 39417/1987, and 39418/1987.

Furthermore, use of the addition-polymerizable compounds having in the molecule an amino structure or sulfide structure described in Japanese Patent Laid-Open Nos. 277653/1988, 260909/1988, or 105238/1989 is effective in obtaining a photopolymerizable composition having an exceedingly high photosensitization speed.

Other examples of the addition-polymerizable compound include polyester acrylates such as those described in Japanese Patent Laid-Open No. 64183/1973 and Japanese Patent Publication Nos. 43191/1974 and 30490/1977 and polyfunctional acrylates or methacrylates such as epoxy acrylates obtained by reacting an epoxy resin with (meth)acrylic acid. The examples further include the specific unsaturated compounds described in Japanese Patent Publication Nos. 43946/1971, 40337/1989, and 40336/1989 and the vinylphosphonic acid compounds described in Japanese Patent Laid-Open No. 25493/1990. In some cases, the structure having a perfluoroalkyl group described in Japanese Patent Laid-Open No. 22048/1986 is advantageously used. Also usable are the photocurable monomers and oligomers shown in Nihon Setchaku Kyôkai-shi, Vol. 20, No. 7, pp. 300–308 (1984).

Details of such addition-polymerizable compounds concerning the structures thereof and the methods of use, e.g., as to whether the addition-polymerizable compounds are used alone or in combination, the amount thereof to be added, etc., can be suitably determined without particular limitations according to the performance design of the negative photosensitive lithographic printing plate to be finally obtained. For example, selections are made from the following standpoints. From the standpoint of photosensitization speed, structures having a high unsaturated-group content per molecule are preferred. In many cases, addition-polymerizable compounds having a functionality of 2 or higher are preferred. From the standpoint of increasing the strength of the image areas, i.e., the cured film, it is preferred to use an addition-polymerizable compound having a functionality of 3 or higher. A technique effective in regulating both photosensitivity and strength is to use a combination of addition-polymerizable compounds differing in functionality or polymerizable group (e.g., acrylic esters, methacrylic esters, styrene compounds, and vinyl ether compounds). Compounds having a high molecular weight and compounds having high hydrophobicity bring about a high photosensitization speed and excellent film strength but, in some cases, are undesirable from the standpoints of the rate of development and precipitation from a developing solution. Furthermore, the selection of addition-polymerizable compounds and the method of using the same are important factors which influence the compatibility and dispersibility thereof in other ingredients in the photosensitive layer (e.g., the binder polymer, initiator, and colorant). For example, use of a low-purity compound or use of a combination of two or more addition-polymerizable compounds can improve compatibility.

There also are cases where an addition-polymerizable compound having a specific structure is selected in order to improve adhesion to, e.g., the support or the overcoat layer which will be described later. With respect to the proportion of the addition-polymerizable compounds in the photosensitive layer, higher proportions are advantageous from the standpoint of sensitivity. However, too high proportions thereof pose problems such as the occurrence of undesirable phase separation, troubles in production steps due to tackiness of the photosensitive layer (e.g., production failures attributable to the transfer or adhesion of photosensitive-layer components), and precipitation from a developing solution. From these standpoints, the addition-polymerizable compounds are used in an amount of preferably from 5 to 80% by weight, more preferably from 25 to 75% by weight, based on the nonvolatile ingredients in the photosensitive layer. The addition-polymerizable compounds may be used alone or in combination of two or more thereof. Furthermore, addition-polymerizable compounds having an appropriate structure may be selected and incorporated in an appropriate amount without particular limitations from the standpoints of the degree of polymerization inhibition by oxygen, resolution, blurring, change in refractive index, surface tackiness, etc. In some cases, a coating method for forming a layer constitution containing an undercoat layer and an overcoat layer may be employed.

[Co-Sensitizer]

The sensitivity of the photopolymerizable photosensitive layer can be further improved by incorporating a co-sensitizer thereinto. Although mechanisms of this improvement are unclear, it is thought that many of these are based on the following chemical process. Namely, it is presumed that a co-sensitizer reacts with various intermediate active species (e.g., radicals, peroxides, oxidizing agents, and reducing agents) which have generated as a result of the photoreactions initiated by light absorption by the photopolymerization initiator (initiator system) described above and during the course of the subsequent addition polymerization reaction to thereby newly yield active radicals. Such co-sensitizers can be roughly divided into (a) co-sensitizers which are reduced to generate active radicals, (b) co-sensitizers which are oxidized to generate active radicals, and (c) co-sensitizers which react with lowly active radicals to convert them into more active radicals or which function as a chain transfer agent. However, with respect to many of the co-sensitizers, there are no common opinions as to which group of these the individual compounds belong to.

(a) Compounds which are Reduced to Generate Active Radical:

Compounds having a carbon-halogen bond: The compounds are thought to undergo reductional cleavage of the carbon-halogen bond to generate an active radical. Preferred examples thereof include trihalomethyl-s-triazines and trihalomethyloxadiazoles.

Compounds halving a nitrogen-nitrogen bond: The compounds are thought to undergo reductional cleavage of the nitrogen-nitrogen bond to generate an active radical. Preferred examples thereof include hexaarylbiimidazoles.

Compounds having oxygen-oxygen bond: The compounds are thought to undergo reductional cleavage of the oxygen-oxygen bond to generate an active radical. Preferred examples thereof include organic peroxides.

Onium compounds: The compounds are thought to undergo reductional cleavage of a carbon-heteroatom bond or oxygen-nitrogen bond thereof to generate an active radical. Preferred examples thereof include diaryliodonium salts, triarylsulfonium salts, and N-alkoxypyridinium (-azinium) salts.

Ferrocene and iron-arene complexes: The compounds can reductionally generate an active radical.

(b) Compounds which are Oxidized to Generate Active Radical:

Alkylate complexes: The compounds are thought to undergo oxidative cleavage of a carbon-heteroatom bond thereof to generate an active radical. Preferred examples thereof include triarylalkylborates.

Alkylamine compounds: The compounds are thought to undergo oxidative cleavage of a C—X bond on the carbon atom adjacent to the nitrogen atom to generate an active radical. Preferred examples of X include a hydrogen atom, carboxyl, trimethylsilyl, and benzyl. Examples of the compounds include ethanolamine and derivatives thereof, N-phenylglycine and derivatives thereof, and N-trimethylsilylmethylaniline and derivatives thereof.

Sulfur-containing compounds and tin-containing compounds: The compounds having the same structure as the above-described amine compounds except that the nitrogen atom has been replaced with a sulfur or tin atom can generate an active radical by the same mechanism. Furthermore, compounds having an S—S bond are also known to sensitize based on S—S-cleavage.

α-Substituted methylcarbonyl compounds: The compounds can undergo oxidative cleavage of the bond between the carbonyl and the α-carbon to generate an active radical. The compounds formed by converting the carbonyl of these compounds into an oxime ether also function likewise. Examples of such compounds include 2-alkyl-1-[4-(alkylthio)phenyl]-2-morpholinopronone-1's and the oxime ether compounds obtained by reacting these compounds with a hydroxylamine compound and then etherifying the N—OH.

Sulfinic acid salts: The compounds can reductionally generate an active radical. Examples thereof include sodium arylsulfinates.

(c) Compounds Which React With A Radical To Convert It Into A Highly Active Radical or Function As A Chain Transfer Agent:

Compounds having, for example, SH, PH, SiH, or GeH in the molecule are used. These compounds can donate hydrogen to a lowly active radical species to generate a radical, or can be oxidized and then deprived of a proton to generate a radical. Examples thereof include 2-mercaptobenzimidazole and derivative thereof.

Many specific examples of those co-sensitizers are given, for example, in Japanese Patent Laid-Open No. 236913/1934 as additives intended to improve sensitivity. Part of these are shown below. However, co-sensitizers usable in the photosensitive layer in the negative photosensitive lithographic printing plate of the invention should not be construed as being limited to these.

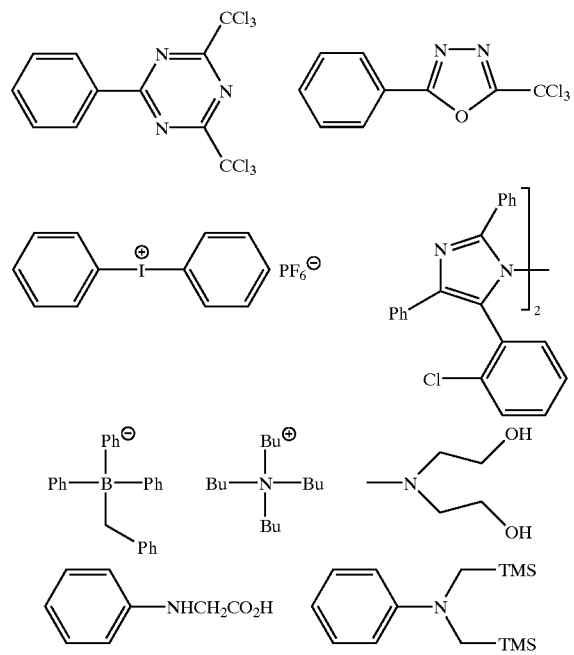

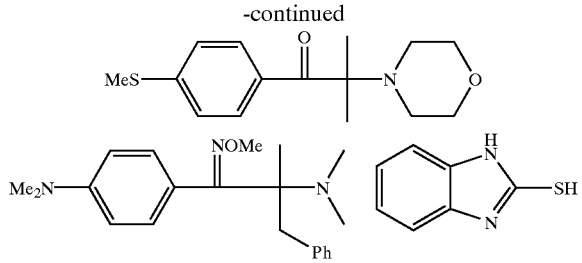

Those co-sensitizers also can be subjected to various chemical modifications in order to improve the properties of the photosensitive layer. Examples of usable modification techniques include bonding to a radical-generating part of, e.g., a sensitizing dye, titanocene, or addition-polymerizable unsaturated compound, incorporation of a hydrophilic group, improvement of compatibility, incorporation of a substituent for inhibiting crystal precipitation, incorporation of a substituent for improving adhesion, and conversion into a polymer.

Those co-sensitizers can be used alone or in combination of two or more thereof. The co-sensitizers are used in an amount of generally from 0.05 to 100 parts by weight, preferably from 1 to 80 parts by weight, more preferably from 3 to 50 parts by weight, per 100 parts by weight of the compound having one or more ethylenically unsaturated double bonds.

[Polymerization Inhibitor]

In forming the photo- or heat-polymerizable negative type photosensitive layer which is an especially preferred photosensitive layer for use in the negative photosensitive lithographic printing plate of the invention, it is desirable to add a small amount of a heat polymerization inhibitor in order to inhibit the compound having one or more, polymerizable, ethylenically unsaturated double bonds from undergoing unnecessary heat polymerization during the production or storage of a negative type photosensitive composition. Appropriate examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), and N-nitrosophenylhydroxylamine cerous salt. The heat polymerization inhibitor is added in an amount of preferably about from 0.01 to 5% by weight based on the nonvolatile ingredients contained in the whole composition. Furthermore, a technique for preventing polymerization inhibition caused by oxygen may be used according to need which comprises adding a higher fatty acid or derivative thereof, such as behenic acid or behenamide, and causing the compound to be present in a higher concentration on the surface of the photosensitive layer during the drying of the layer after coating. The amount of the higher fatty acid or derivative to be added is preferably about from 0.5 to 10% by weight based on the nonvolatile ingredients contained in the whole composition.

[Colorant]

A dye or pigment may be added to the photosensitive layer in the negative photosensitive lithographic printing plate of the invention for the purpose of coloring the layer.

By the addition of a dye or pigment, the printing plate made from the photosensitive lithographic printing plate can be improved in suitability for plate inspection, such as visibility and suitability for examination with an image density meter. Pigments are especially preferred colorants because many dyes reduce the sensitivity of the photopolymerizable photosensitive layer. Examples of the colorant include pigments such as phthalocyanine pigments, azo pigments, carbon black, and titanium oxide and dyes such as Ethyl Violet, Crystal Violet, azo dyes, anthraquinone dyes, and cyanine dyes. The amount of such dyes and pigments to be added is preferably about from 0.5 to 5% by weight based on the nonvolatile ingredients contained in the whole composition.

[Other Additives]

Other known additives may be further added in order to improve the properties of the cured film. Examples thereof include inorganic fillers, plasticizers, and ink receptivity agents capable of improving the ink receptivity of the photosensitive-layer surface.

Examples of the plasticizers include dioctyl phthalate, didodecyl phthalate, triethylene glycol dicaprylate, dimethyl glycol phthalate, tricresyl phosphate, dioctyl adipate, dibutyl sebacate, and triacetylglycerol. Such plasticizers may be added in an amount of generally up to 10% by weight based on the sum of the polymeric binder and the addition-polymerizable compound.

For the purpose of improving film strength (press life), which will be described later, an additive such as a UV initiator or heat-crosslinking agent may be added in order to heighten the effect of heating/exposure after development.

In a method for forming the photosensitive layer, a photopolymerizable composition comprising the ingredients for the photosensitive layer is dissolved in any of various organic solvents and the resultant coating solution may be applied to a support or an interlayer which will be described later. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethyleneglycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used alone or as a mixture of two or more thereof. An appropriate range of the solid concentration in the coating solution is from 2 to 50% by weight.

The coating amount of the coating solution for forming the photosensitive layer mainly influences the sensitivity and developability of the photosensitive layer and the strength and press life of the film obtained through exposure. It is therefore desirable to select a suitable coating amount according to the intended use of the photosensitive printing plate. If the coating amount thereof is too low, press life is insufficient. On the other hand, too high coating amount thereof are undesirable in that the photosensitive layer has reduced sensitivity and necessitates much time for exposure and, in addition, the development thereof requires a longer time period. In the case where the negative photosensitive lithographic printing plate is one intended to be subjected to scanning exposure, which is a major purpose of the invention, the coating amount of the coating solution for forming the photosensitive layer is preferably about from 0.1 to 10 g/m$^2$, more preferably from 0.5 to 5 g/m$^2$, on a dry basis.

[Support]

Known hydrophilic supports for use in negative photosensitive lithographic printing plates can be used without particular limitations as the support of the negative photosensitive lithographic printing plate of the invention. It is preferred to use a plate-shaped support which is dimensionally stable. Examples thereof include papers, papers laminated with a plastic (e.g., polyethylene, polypropylene, or polystyrene), sheets of metals (e.g., aluminum, zinc, and copper), films of plastics (e.g., cellulose diacetate, cellulose triacetate, cellulose propionate, cellulose butyrate, cellulose acetate butyrate, cellulose nitrate, poly(ethylene terephthalate), polyethylene, polystyrene, polypropylene, polycarbonates, and poly(vinyl acetal)s), and papers or plastic films coated with any of those metals by laminating or vapor deposition. A surface of such supports may be subjected to appropriate, known, physical or chemical treatments for the purpose of imparting hydrophilicity, improving strength, etc. according to need.

Especially preferred examples of the support include papers, polyester films, and aluminum sheets. More preferred of these are aluminum sheets because they have satisfactory dimensional stability, are relatively inexpensive, and can be made to have a surface excellent in hydrophilicity and strength through appropriate surface treatments according to need. Also preferred is a composite sheet comprising a poly(ethylene terephthalate) film and an aluminum sheet bonded thereto, such as that described in Japanese Patent Publication No. 18327/1973.

The term "aluminum sheet" as used herein means a metallic sheet comprising aluminum as a major component and having dimensional stability. The aluminum sheet is selected from sheets of pure aluminum, sheets of an alloy of aluminum as the main component with a small amount of one or more other elements, and plastic films or papers coated with aluminum (or an aluminum alloy) by laminating or vapor deposition.

In the following explanations, the aforementioned supports comprising aluminum or an aluminum alloy are inclusively referred to as aluminum supports. Examples of elements other than aluminum which are contained in the aluminum alloy include silicon, iron, manganese, copper, magnesium, chromium, zinc, bismuth, nickel, and titanium. The content of such non-aluminum elements in the alloy is up to 10% by weight. Although a sheet of pure aluminum is preferred in the invention, an aluminum sheet containing a slight amount of non-aluminum elements may be used because completely pure aluminum is difficult to produce by the current refining technology. As described above, the aluminum sheet to be used in the invention is not limited in composition. It can be suitably selected from sheets of known aluminum materials in general use such as, e.g., JIS A 1050, JIS A 1100, JISA3103, and JISA3005. The thickness of the aluminum support to be used in the invention is about from 0.1 to 0.6 mm. This thickness can be suitably varied according to the size of the printing machine to be used, the size of the intended printing plate, and the desire of the user. The aluminum support may be suitably subjected according to need to the surface treatments which will be described below. It may, of course, be used without any surface treatment.

[Surface-Roughening Treatment]

Examples of surface-roughening treatments include mechanical surface roughening, chemical etching, and electrolytic graining such as those disclosed in Japanese Patent Laid-Open No. 28893/1981. Also usable are an electrochemical surface-roughening method in which the aluminum surface is electrochemically roughened in an electrolytic solution of hydrochloric acid or nitric acid and mechanical surface-roughening methods such as the wire brush graining method in which the aluminum surface is scratched with a metal wire, the ball graining method in which the aluminum surface is sandblasted with abrasive spheres and an abrasive material, and the brush graining method in which the aluminum surface is roughened with a nylon brush and an abrasive material. These surface-roughening methods may be used alone or in combination of two or more thereof.

Of those methods, the electrochemical method in which the aluminum surface is chemically roughened in an electrolytic solution of hydrochloric acid or nitric acid is useful for surface roughening. The quantity of electricity applied to the support serving as the anode is in the range of from 50 to 400 $C/dm^2$. More specifically, it is preferred to conduct AC and/or DC electrolysis in an electrolytic solution containing 0.1 to 50% hydrochloric acid or nitric acid under the conditions of a temperature of from 20 to 80° C., an electrolysis time of from 1 second to 30 minutes, and a current density of from 100 to 400 $C/dm^2$.

The aluminum support which has undergone such a surface-roughening treatment may be chemically etched with an acid or alkali. Examples of etchants suitable for this etching include caustic soda, sodium carbonate, sodium aluminate, sodium metasilicate, sodium phosphate, potassium hydroxide, and lithium hydroxide. The preferred ranges of concentration and temperature are from 1 to 50% and from 20 to 100° C., respectively. After the etching, pickling is conducted in order to remove the smut remaining on the surface. Examples of acids which can be used for this pickling include nitric acid, sulfuric acid, phosphoric acid, chromic acid, hydrofluoric acid, and borofluoric acid. Preferred examples of methods for smut removal especially after the electrochemical surface-roughening treatment include the method in which the support surface is brought into contact with 15 to 65% by weight sulfuric acid at a temperature of from 50 to 90° C. as described in Japanese Patent Laid-Open No. 12739/1978 and the method in which the support surface is alkali-etched as described in Japanese Patent Publication No. 28123/1973.

Methods and conditions for the surface-roughening treatment and post-treatments are not particularly limited as long as the roughened surface of the support thus treated has a center-line average surface roughness Ra of from 0.2 to 0.5 μm.

[Anodization Treatment]

The aluminum support thus treated, which has an oxide layer formed thereon, is subjected to an anodization treatment. In this anodization treatment, an aqueous solution of sulfuric acid, phosphoric acid, oxalic acid, or boric acid/sodium borate or a combination of two or more of solutions of these is used as the main component of an electrolytic bath. This electrolytic solution may, of course, contain at least the ingredients usually contained in the aluminum alloy sheet, an electrode, tap water, underground water, etc. The electrolytic solution may further contain second and third ingredients added thereto. Examples of the second and third ingredients include cations such as ions of metals such as Na, K, Mg, Li, Ca, Ti, Al, V, Cr, Mn, Fe, Co, Ni, Cu, and Zn and ammonium ions and anions such as nitrate ions, carbonate ions, chlorine ions, phosphate ions, fluorine ions, sulfite ions, titanate ions, silicate ions, and borate ions. The concentration of such ions in the electrolytic solution may be about from 0 to 10,000 ppm. There are no particular limitations on the conditions for the anodization treatment. However, the treatment is preferably conducted by DC or AC electrolysis under the conditions of a concentration of from 30 to 500 g/L, a treating-liquid temperature of from 10 to 70° C., and a current density of from 0.1 to 40 $A/m^2$. The thickness of the film thus formed by anodization is from 0.5 to 1.5 μm, preferably from 0.5 to 1.0 μm.

Conditions for the anodization treatment should be selected so that the anodization film formed on the support thus treated has micropores having a diameter of from 5 to 10 nm and a pore density of from $8 \times 10^{15}$ to $2 \times 10^{16}$ pores per $m^2$.

For hydrophilizing the support surface, various known methods can be used. In an especially preferred treatment, the support surface is hydrophilized with a silicate, polyvinylphosphonic acid, or the like. A film is formed in an amount of generally from 2 to 40 $mg/m^2$, more preferably from 4 to 30 $mg/m^2$, in terms of silicon or phosphorus amount.

The amount of the film deposited can be determined by fluorescent X-ray spectroscopy.

The hydrophilizing treatment described above can be accomplished by immersing the aluminum support having an anodization film in an aqueous alkali metal silicate or polyvinylphosphonic acid solution having a concentration of from 1 to 30% by weight, preferably from 2 to 15% by weight, and a pH at 25° C. of from 10 to 13. The immersion is conducted, for example, at a temperature of from 15 to 80° C. for from 0.5 to 120 seconds.

Examples of the alkali metal silicate used in the hydrophilizing treatment include sodium silicate, potassium silicate, and lithium silicate. A hydroxide may be used for heightening the pH of the aqueous alkali metal silicate solution, and examples thereof include sodium hydroxide, potassium hydroxide, and lithium hydroxide.

A salt of an alkaline earth metal or a salt of a Group IVB metal may be incorporated into the treating liquid. Examples of the salt of an alkaline earth metal include water-soluble salts such as nitrates, e.g., calcium nitrate, strontium nitrate, magnesium nitrate, and barium nitrate, sulfates, hydrochlorides, phosphates, acetates, oxalates, and borates. Examples of the salt of a Group IVB metal include titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride.

Such alkaline earth metal salts and Group IVB metal salts can be used alone or in combination of two or more thereof. The amount of such metal salts to be added is preferably from 0.01 to 10% by weight, more preferably from 0.05 to 5.0% by weight.

Silicate electrodeposition such as that described in U.S. Pat. No. 3,658,662 is also effective. Furthermore, a surface treatment comprising a combination of the electrolytic graining disclosed in Japanese Patent Publication No. 27481/1971 or Japanese Patent Laid-Open No. 58602/1977 or 30503/1977 with the anodization treatment and hydrophilizing treatment described above is also effective in preparing a support.

[Interlayer]

An interlayer may be formed in the negative photosensitive lithographic printing plate of the invention for the purposes of improving adhesion between the photosensitive layer and the support and improving non-smearing properties. Examples of the interlayer include those described in Japanese Patent Publication No. 7481/1975, Japanese Patent Laid-Open Nos. 72104/1979, 101651/1984, 149491/1985, 232998/1985, 56177/1991, 282637/1992, 16558/1993, 246171/1993, 159983/1995, 314937/1995, 202025/1996, 320551/1996, 34104/1997, 236911/1997, 269593/1997, 69092/1998, 115931/1998, 161317/1998, 260536/1998, 282682/1998, 84674/1999, 69092/1998, 115931/1998, 38635/1999, 38629/1999, 282645/1998, 301262/1998, 24277/1999, 109641/1999, 319600/1998, 84674/1999, 327152/1999, and 2000-10292, and Japanese Patent Applications Nos. 36377/1999, 165861/1999, 284091/1999, and 2000-14697.

[Protective Layer]

In the negative photosensitive lithographic printing plate having a photo- or heat-polymerizable negative type photosensitive layer, which is a preferred embodiment of the invention, it is generally preferred to form a protective layer on the photosensitive layer in order to enable the photosensitive printing plate to be exposed in the air. The protective layer prevents the low-molecular compounds such as oxygen and basic substances present in the air, which inhibit an image-forming reaction induced in the photosensitive layer by exposure, from coming into the photosensitive layer to thereby enable exposure to be conducted in the air. Consequently, the properties which the protective layer is desired to have are: low permeability to low-molecular compounds including oxygen; the property of not substantially inhibiting transmission of the light to be used for exposure; excellent adhesion to the photosensitive layer; and the ability to be easily removed in a development step after exposure. Various measures in imparting such properties to a protective layer have hitherto been taken, and are described in detail in U.S. Pat. No. 3,458,311 and Japanese Patent Laid-Open No. 49729/1980. Preferred examples of materials usable for forming the protective layer include water-soluble polymeric compounds having relatively high crystallinity. Specific known examples thereof include poly (vinyl alcohol)s, polyvinylpyrrolidone, acid cellulose derivatives, gelatins, gum arabic, and poly(acrylic acid) However, use of a poly(vinyl alcohol), among these polymers, as the main component gives most satisfactory results with respect to basic properties including oxygen barrier properties and removability by development. The poly(vinyl alcohol) to be used in the protective layer may be one partly substituted with an ester, ether, and acetal, as long as it contains unsubstituted vinyl alcohol units, which enable the polymer to have the necessary oxygen barrier properties and water solubility. For the same reason, a poly(vinyl alcohol) composed of units partly derived from one or more comonomers may be used. Examples of the poly(vinyl alcohol) include ones which have a degree of hydrolysis of from 71 to 100% and a molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8, all manufactured by Kuraray Co., Ltd.

Not only oxygen barrier properties and removability by development but also blurring, adhesion, and marring resistance are taken in account in selecting ingredients for the protective layer (kind of PVA and use of additives), the amount of the layer to be formed by coating, etc. In general, a protective layer containing a PVA with a higher degree of hydrolysis (a higher content of unsubstituted vinyl alcohol units) and having a larger thickness has higher oxygen barrier properties and is advantageous in sensitivity. However, excessively enhanced oxygen barrier properties pose problems that an unnecessary polymerization reaction occurs during production or storage before exposure, and that imagewise exposure results in unnecessary blurring or line with enlargement. Furthermore, adhesion to the image areas and marring resistance also are extremely important for plate handling. Specifically, when a hydrophilic layer comprising a water-soluble polymer is superposed on the oleophilic photosensitive layer, then the hydrophilic layer is apt to peel off the photosensitive layer due to its insufficient adhesive strength and the resultant uncovered parts of the photosensitive layer cause defects such as curing failures due to polymerization inhibition by oxygen. For improving adhesion between the two layers so as to eliminate these problems, various proposals have been made. For example, U.S. Pat. Nos. 292,501 and 44,563 describe a technique for obtaining sufficient adhesion which comprises mixing a hydrophilic polymer consisting mainly of a poly(vinyl alcohol) with from 20 to 60% by weight acrylic emulsion, water-insoluble vinylpyrrolidone/vinyl acetate copolymer, or the like and superposing the mixture on a photosensitive layer. Any of such known techniques can be applied to the protective layer in the invention. Such methods for forming a protective layer by coating are described in detail in, e.g., U.S. Pat. No. 3,458,311 and Japanese Patent Laid-Open No. 49729/1980.

In a plate-making process for plate-making a lithographic printing plate from the negative photosensitive lithographic printing plate of the invention, the plate may be wholly heated according to need before and during exposure and during the period of from the exposure to development. This heating accelerates an image-forming reaction in the photosensitive layer to bring about advantages of improved sensitivity, improved press life, and stabilized sensitivity. Furthermore, the technique in which the image formed through development is wholly subjected to post-heating or exposure is effective in improving image area strength and press life. It is generally preferred that the heating before development be conducted under such mild conditions that the plate is heated at 150° C. or lower. Too high temperatures pose problems, for example, that the nonimage areas are blurred. Exceedingly severe conditions are used for the heating after development. Usually, this heating is conducted at a temperature in the range of from 200 to 500° C. Too low temperatures are ineffective in sufficiently heightening the image area strength, while too high temperatures pose problems of deterioration of the support and pyrolysis in the image areas.

For exposing the negative photosensitive lithographic printing plate of the invention, known methods can be used without particular limitations. It is desirable to use a light source which emits a light having a wavelength of from 300 to 1,200 nm. Preferred examples of the light source include various lasers. The mechanism of exposure maybe any of the internal drum exposure, external drum exposure, flat bed exposure, and the like. A highly water-soluble ingredient may be used as a component of the photosensitive layer in the negative photosensitive lithographic printing plate of the invention, whereby the photosensitive layer can be made soluble in neutral water and weakly alkaline water. A negative photosensitive lithographic printing plate having this constitution can be used also in such a manner that it is attached to a printing machine and subjected to exposure and development thereon.

Other examples of the light source for use in exposing the negative photosensitive lithographic printing plate of the invention include ultrahigh-pressure, high-pressure, medium-pressure, and low-pressure mercury lamps, chemical lamps, carbon arc lamps, xenon lamps, metal halide lamps, various laser lamps emitting visible or ultraviolet light, fluorescent lamps, tungsten lamps, and sunlight.

The negative photosensitive lithographic printing plate of the invention is developed after exposure.

An aqueous alkali solution having a pH of 14 or lower is an especially preferred developing solution for use in the development. More preferred is an aqueous alkali solution having a pH of from 8 to 12 and containing an anionic surfactant. Examples of the alkali include inorganic alkalis such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide. Also usable are organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

Those alkalis may be used alone or in combination of two or more thereof.

An anionic surfactant is preferably added to the developing solution for use in developing the negative photosensitive lithographic printing plate of the invention in an amount of generally from 1 to 20% by weight, preferably from 3 to 10% by weight. Too small amounts thereof result in impaired developability, while too large amounts thereof produce adverse influences such as deterioration in strength, e.g., wearing resistance, in the image areas.

Examples of the anionic surfactant include sodium lauryl sulfate, ammoniumlauryl sulfate, sodiumoctyl sulfate, salts of alkylarylsulfonic acids, such as sodium isopropylnaphthalenesulfonate, sodium isobutylnaphthalenesulfonate, the sodium salt of polyoxyethylene glycol mononaphthyl ether sulfate, sodium dodecylbenzenesulfonate, and sodium m-nitrobenzenesulfonate, sulfuric esters of higher alcohols having 8 to 22 carbon atoms, such as disodium alkyl sulfates, phosphoric esters of aliphatic alcohols, such as sodium cetyl phosphate, alkylamide sulfonate salts such as $C_{17}H_{33}CON(CH_3)CH_2CH_2SO_3Na$, and salts of esters of dibasic aliphatic sulfonic acids, such as sodium dioctyl sulfosuccinate and sodium dihexyl sulfosuccinate.

A slightly water-miscible organic solvent, e.g., benzyl alcohol, can be added to the developing solution according to need. Suitable organic solvents have a solubility in water of about 10% by weight or lower. Preferably, an appropriate organic solvent is selected from ones having a solubility in water of 5% by weight or lower. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. The content of such an organic solvent is preferably from 1 to 5% by weight based on the total amount of the developing solution in use. The amount of the organic solvent to be used is closely related to the amount of the surfactant to be used. It is preferred to increase the amount of the anionic surfactant as the amount of the organic solvent increases. This is because if a large amount of an organic solvent is added to a developing solution containing a small amount of an anionic surfactant, the organic solvent partly remains undissolved, making it impossible to expect satisfactory developability.

Additives such as an antifoamer and a water softener can be further added according to need. Examples of the water softener include polyphosphoric acid salts such as $Na_2P_2O_7$, $Na_5P_3O_3$, $Na_3P_3O_9$, $Na_2O_4P$ $(NaO_3P)$ $PO_3Na$, and Calgon (sodium polymetaphosphate); aminopolycarboxylic acids and derivatives thereof, such as ethylenediaminetetraacetic acid and potassium salts and sodium salts thereof, diethylenetriaminepentaacetic acid and potassium salts and sodium salts thereof, triethylenetetraminehexaacetic acid and potassium salts and sodium salts thereof, hydroxyethylethylenediaminetriacetic acid and potassium salts and sodium salts thereof, nitrilotriacetic acid and potassium salts and sodium salts thereof, 1,2-diaminocyclohexanetetraacetic acid and potassium salts and sodium salts thereof, and 1,3-diamino- 2-propanoltetraacetic acid and potassium salts and sodium salts thereof; and organic phosphonic acids and derivatives thereof, such as 2-phosphono-1,2,4-butanetricarboxylic acid and potassium salts and sodium salts thereof, 2-phosphono-2,3,4-butanetricarboxylic acid and potassium salts and sodium salts thereof, 1-phosphono-1,2,2-ethanetricarboxylic acid and potassium salts and sodium salts thereof, 1-hydroxyethane-1,1-diphosphonic acid and potassium salts and sodium salts thereof, and aminotri(methylenephosphonic acid) and potassium salts and sodium salts thereof. The optimal amount of such a water softener to be added varies depending on the hardness and amount of the hard water used. In general, however, a water softener may be incorporated into the developing solution in use in an amount of from 0.01 to 5% by weight, preferably from 0.01 to 0.5% by weight.

In the case where an automatic processor is used in developing the negative photosensitive lithographic printing plate, the developing solution fatigues according to the amount of plates processed. In this case, the processing ability may be recovered with a replenisher or a fresh developing solution. This replenishment is preferably conducted by the method described in U.S. Pat. No. 4,882,246.

Also preferred are the developing solutions described in Japanese Patent Laid-Open Nos. 26601/1975 and 54341/1983 and Japanese Patent Publication Nos. 39464/1981, 42860/1981, and 7427/1982.

The negative photosensitive lithographic printing plate thus developed is post-treated with washing water, a rinse containing a surfactant and other ingredient, and a desensitizing liquid containing gum arabic, a starch derivative, etc., in the manner described, e.g., in Japanese Patent Laid-Open Nos. 8002/1979, 115045/1980, or 58431/1984. Various combinations of these treatments can be used for the post-treatment of the negative photosensitive lithographic printing plate of the invention.

The lithographic printing plate obtained through such treatments is mounted on an offset press and used to print many sheets.

A plate cleaner may be used for removing smudges present on the plate during printing. As the cleaner is used a known plate cleaner for PS plates. Examples thereof include CL-1, CL-2, CP, CN-4, CN, CG-1, PC-1, SR, and IC (all manufactured by Fuji Photo Film Co., Ltd.).

The invention will be explained below in more detail by reference to the following Examples, but the invention should not be construed as being limited thereto.

SYNTHESIS EXAMPLE 1

In 775.0 g of pure water was dissolved 44.7 g of a poly(vinyl alcohol) having a degree of saponification of 99% and a weight-average degree of polymerization of 500. This aqueous solution was cooled to 5° C., and 1.6 g of concentrated hydrochloric acid (35% by weight) was added thereto with stirring. Furthermore, 60.6 g of 4-(2-acryloyloxyethoxy)benzaldehyde synthesized by the method described in the Example 1 of International Patent Publication No. 2000-506282 was added dropwise to the solution over 10 minutes. Precipitation began at 45 minutes after initiation of the dropwise addition. The reaction mixture was heated to 40° C. after 2 hours and then held at this temperature for 4 hours to obtain poly(vinyl acetal). This poly(vinyl acetal) was washed twice with pure water and then neutralized by dispersing the poly(vinyl acetal) into 800 g of pure water and continuously stirring the dispersion for 4 hours while keeping the pH thereof at 9.5. The poly(vinyl acetal) thus obtained was dehydrated and then continuously extracted with n-hexane as a solvent by means of a Soxhlet's extractor over a whole day and night to remove the residual aldehyde. Thus, 101.2 g of poly(vinyl acetal) having acryloyl groups as crosslinkable groups was obtained. This poly(vinyl acetal) had a degree of polymerization of 550, and the number of residual hydroxyl groups and residual acetyl groups contained therein were 44 and 1, respectively.

SYNTHESIS EXAMPLE 2

To 170 g of N,N-dimethylformamide was added 25.3 g of the poly(vinyl acetal) obtained in Synthesis Example 1. This mixture was stirred at 50° C. for 3 hours to dissolve the polymer. A solution of 6.1 g of 1,2-cyclohexanedicarboxylic anhydride in 30 g of N,N-dimethylformamide was added dropwise thereto at 50° C. over 15 minutes. Thereafter, 0.6 g of 4-(dimethylamino) pyridine was added thereto and the resultant mixture was stirred at 50° C. for 8 hours and then allowed to cool. At the time when the temperature thereof had reached 60° C., 7.3 g of acetic acid was added. This solution was cooled to room temperature and then poured into a mixture of 1,400 g of water and 40 g of methanol. The resultant mixture was stirred for 2 hours. The white solid thus precipitated was taken out by filtration and dried to thereby obtain 30.5 g of the polymer (P-1) shown in Table 1. The weight-average molecular weight of this polymer, as measured by gel permeation chromatography and calculated for standard polystyrene, was 67,000. The numbers of residual hydroxyl groups and residual acetyl groups contained therein were 16 and 1, respectively. This polymer had an acid value of 1.24 meq/g.

SYNTHESIS EXAMPLE 3

The binder polymers (P-2) to (P-20) and comparative samples (PR-1) to (PR-4) shown in Table 1 were obtained in the same manner.

TABLE 1

| Binder polymer | Component a | Component b | Component c | Component d | Component e | Component proportion by mole (a/b/c/d/e) | Molecular weight (× 10000) | Acid value (meq/g) |
|---|---|---|---|---|---|---|---|---|
| P-1 | I-1 | III-5 | PVA | PVAc | — | 55/28/16/1— | 6.7 | 1.24 |
| P-2 | I-1 | III-7 | PVA | PVAc | — | 20/32/29/20/— | 4.5 | 2.25 |
| P-3 | I-1 | III-3 | IV-1 | PVA | PVAc | 36/22/21/17/4 | 9.6 | 1.10 |

TABLE 1-continued

| Binder polymer | Component a | Component b | Component c | Component d | Component e | Component proportion by mole (a/b/c/d/e) | Molecular weight (× 10000) | Acid value (meq/g) |
|---|---|---|---|---|---|---|---|---|
| P-4 | I-1 | II-4 | III-10 | PVA | PVAc | 34/9/41/15/1 | 3.6 | 1.94 |
| P-5 | I-2 | III-6 | IV-5 | PVA | PVAc | 15/36/40/7/2 | 5.0 | 1.56 |
| P-6 | I-2 | I-3 | III-5 | PVA | PVAc | 20/25/22/26/7 | 1.9 | 0.95 |
| P-7 | I-3 | III-1 | PVAc | — | — | 65/32/3/—/— | 2.9 | 1.02 |
| P-8 | I-4 | III-9 | IV-4 | PVA | PVAc | 26/41/24/8/1 | 7.4 | 1.60 |
| P-9 | I-5 | III-4 | PVA | — | — | 42/25/33/—/— | 6.6 | 1.11 |
| P-10 | I-6 | III-8 | IV-3 | PVA | PVAc | 35/9/15/26/15 | 0.8 | 0.75 |
| P-11 | I-7 | III-5 | IV-6 | PVA | PVAc | 35/45/5/10/5 | 15.8 | 2.46 |
| P-12 | I-8 | I-9 | III-6 | — | — | 35/35/30/—/— | 3.9 | 0.94 |
| P-13 | I-8 | III-10 | PVA | PVAc | — | 9/46/30/15/— | 5.2 | 3.01 |
| P-14 | I-9 | III-2 | PVA | PVAc | — | 45/33/20/2/— | 0.9 | 1.52 |
| P-15 | I-9 | II-2 | III-4 | IV-2 | PVA | 10/30/40/15/5 | 5.8 | 2.01 |
| P-16 | I-10 | III-1 | III-5 | PVA | PVAc | 9/8/43/30/10 | 4.7 | 2.77 |
| P-17 | II-1 | III-10 | PVA | PVAc | — | 38/34/24/4/— | 10.6 | 2.23 |
| P-18 | II-2 | II-4 | III-2 | PVA | PVAc | 20/15/25/38/2 | 1.5 | 1.99 |
| P-19 | II-3 | III-1 | III-9 | PVA | PVAc | 40/30/10/19/1 | 12.5 | 3.35 |
| P-20 | II-4 | III-5 | IV-6 | PVA | PVAc | 42/35/15/7/1 | 2.6 | 1.87 |
| PR-1 | III-1 | IV-1 | PVA | PVAc | — | 33/50/17/5/— | 7.2 | 2.15 |
| PR-2 | III-3 | IV-2 | PVA | PVAc | — | 25/57/8/10/— | 4.7 | 1.66 |
| PR-3 | I-1 | PVA | PVAc | — | — | 55/44/1/—/— | 3.5 | 0 |
| PR-4 | II-4 | IV-6 | PVA | PVAc | — | 25/40/30/5/— | 6.3 | 0 |

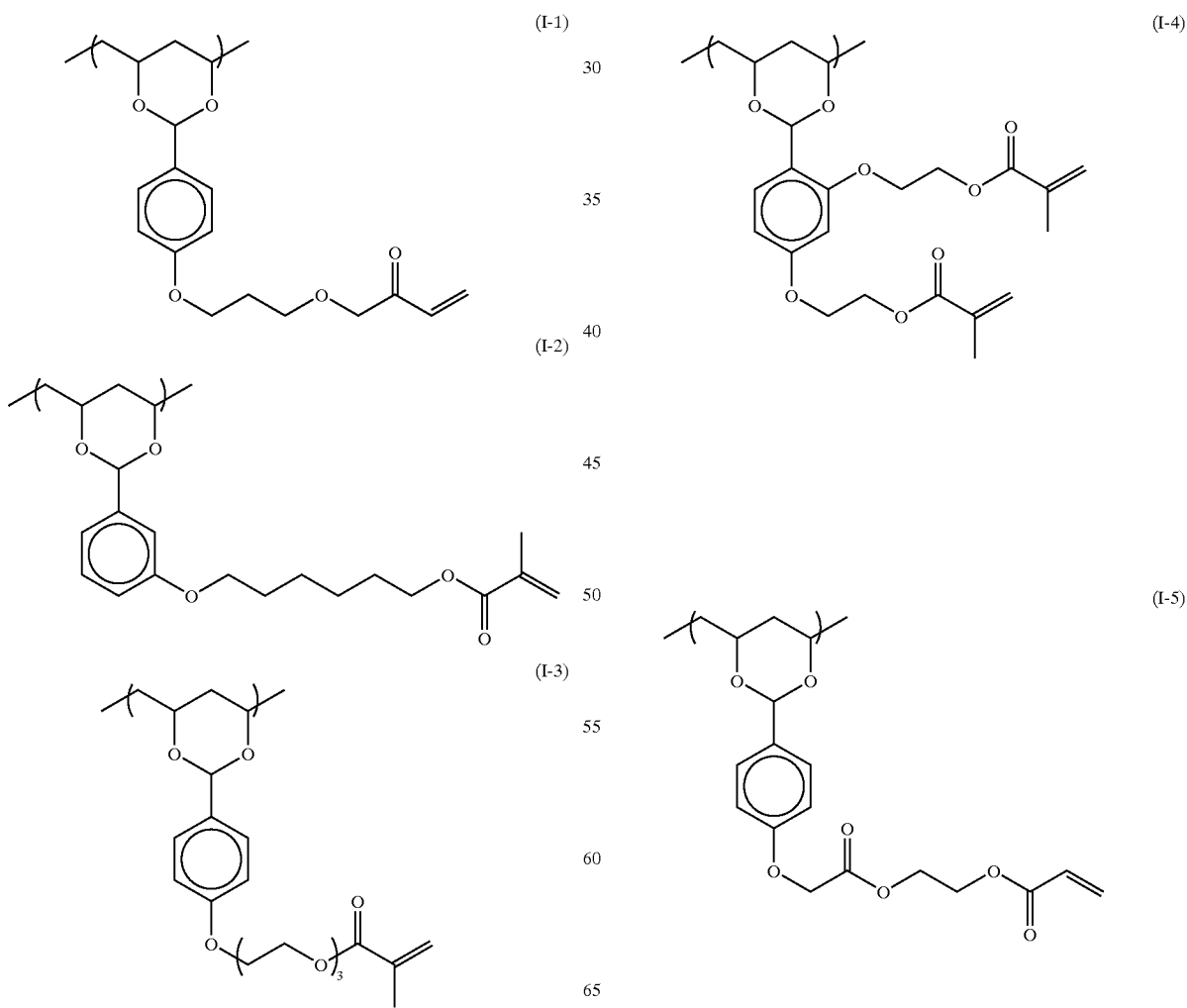

(I-6)
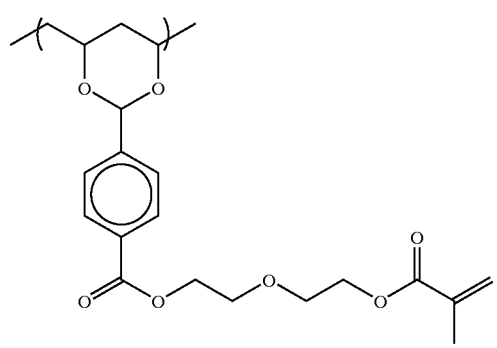
(I-7)
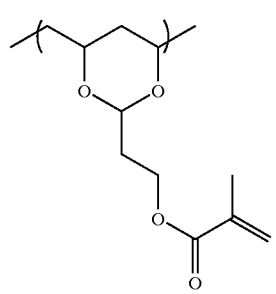
(I-8)
(I-9)
(I-10)
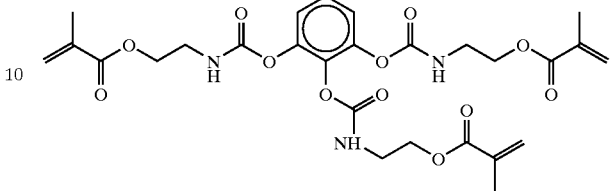
(II-1)
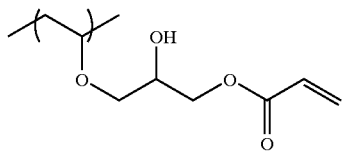
(II-2)
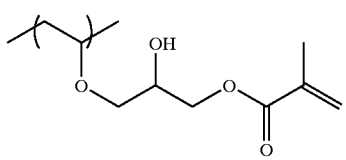
(II-3)
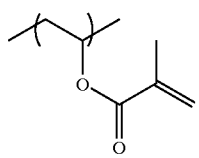
(II-4)
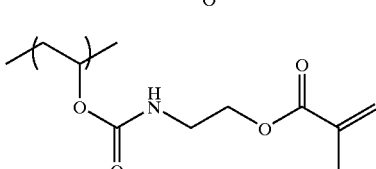
III-1
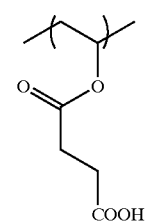
III-2
III-3

III-4 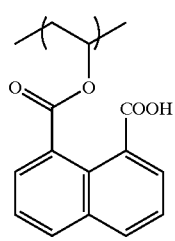
III-5 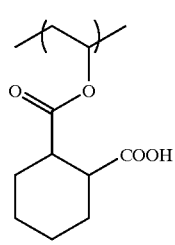
III-6 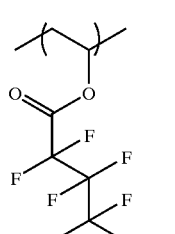
III-7 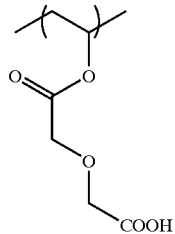
III-8 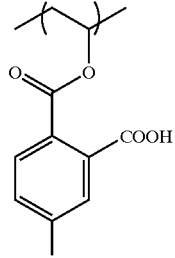
III-9 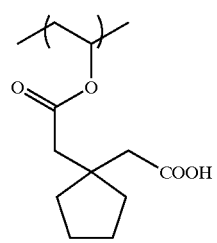
III-10 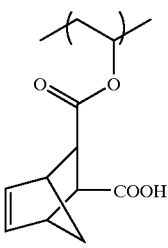
IV-1 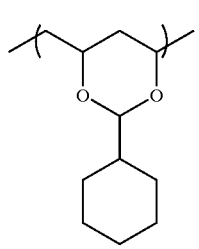
IV-2 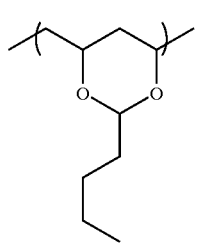
IV-3 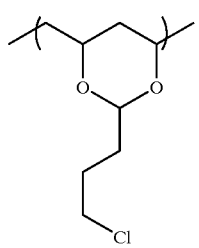
IV-4 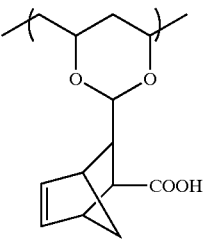
IV-5 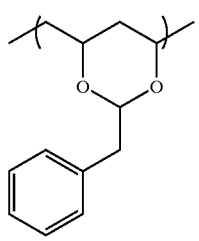

-continued

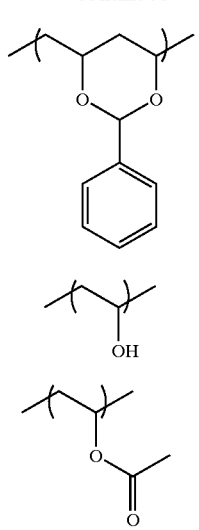

IV-6

PVA

PVAc

EXAMPLES 1 TO 20 AND COMPARATIVE EXAMPLES 1 TO 4

Negative photosensitive lithographic printing plates were produced and evaluated for printing performances in the following manners. The results obtained are shown in Table 2.

[Production of Supports]

A JIS A 1050 aluminum sheet having a thickness of 0.24 mm and a width of 1030 mm was continuously treated in the following manner.

(a) An existing mechanically surface-roughening apparatus was used to mechanically roughen a surface of the aluminum sheet with rotating nylon brush rollers while supplying a suspension of an abrasive material (pumice) having a specific gravity of 1.12 in water as an abrasive slurry to the aluminum sheet surface. The abrasive material had an average particle diameter of from 40 to 45 $\mu$m and a maximum diameter of 200 $\mu$m. The nylon brushes were made of nylon-6, 10 and had a bristle length of 50 mm and a bristle diameter of 0.3 mm. Three rotating brush rollers were used which each comprised a perforated stainless-steel cylinder having a diameter of 300 mm and bundles of such nylon bristles densely attached thereto by fitting them into the perforations. The apparatus had under the brush rollers two supporting rollers (diameter, 200 mm) apart from each other at a distance of 300 mm. The brush rollers were pressed against the aluminum sheet in such a degree that the load imposed on the driving motor rotating the brush rollers increased to a value higher by 7 kW than that as measured before the brush rollers were pressed against the aluminum sheet. The direction of rotation of the brush rollers was the same as the direction of running of the aluminum sheet, and the rotational speed thereof was 200 rpm.

(b) The aluminum sheet was etched by spraying with an etchant solution having a caustic soda concentration of 2.6% by weight and an aluminum ion concentration of 6.5% by weight at a temperature of 70° C. to dissolve away a surface layer of the aluminum sheet in an amount of 13 g/m². Thereafter, the aluminum sheet was washed with water by spraying.

(c) The aluminum sheet was subjected to a de-smutting treatment by spraying with an aqueous solution having a nitric acid concentration of 1% by weight (containing 0.5% by weight aluminum ions) and a temperature of 30° C. Thereafter, the aluminum sheet was washed with water by spraying. The aqueous nitric acid solution used for the de-smutting was a waste liquid resulting from the step of electrochemical surface roughening with an alternating current in an aqueous nitric acid solution.

(d) A 60 Hz AC voltage was used to continuously conduct an electrochemical surface-roughening treatment. The electrolytic solution used was 1% by weight aqueous nitric acid solution (containing 0.5% by weight aluminum ions and 0.007% by weight ammonium ions) having a temperature of 40° C. The AC power source used was one providing a trapezoidal rectangular wave alternating current wherein the TP, which is the time required for the current value to increase from zero to a peak, was 2 msec and the duty ratio was 1:1. A carbon electrode was used as a counter electrode to conduct the electrochemical surface-roughening treatment using ferrite as an auxiliary anode. The current density was 30 A/dm² in terms of peak value, and the quantity of electricity was 255 C/cm² in terms of the sum of electricity at the time when the aluminum sheet was functioning as an anode. To the auxiliary anode was supplied 5% of the current flowing from the power source. After this surface-roughening treatment, the aluminum sheet was washed with water by spraying.

(e) The aluminum sheet was etched by spraying with an etchant solution having a caustic soda concentration of 26% by weight and an aluminum ion concentration of 6.5% by weight at 32° C. to dissolve away a surface layer of the aluminum sheet in an amount of 0.2 g/m². Thus, the smut ingredients consisting mainly of aluminum hydroxide yielded by the preceding step of electrochemical surface roughening with an alternating current were removed and, simultaneously therewith, the edges of the pits formed were partly dissolved away and rounded. Thereafter, the aluminum sheet was washed with water by spraying.

(f) The aluminum sheet was subjected to a de-smutting treatment by spraying with an aqueous solution having a sulfuric acid concentration of 25% by weight (containing 0.5% by weight aluminum ions) and a temperature of 60° C. Thereafter, the aluminum sheet was washed with water by spraying.

(g) An existing anodizing apparatus based on the two-stage-feed electrolytic processing method (lengths of first and second electrolysis zones, 6 m each; length of first feed zone, 3 m; length of second feed zone, 3 m; lengths of first and second feeder electrodes, 2.4 m each) was used to conduct an anodization treatment under the conditions of a sulfuric acid concentration in the electrolysis zones of 170 g/L (containing 0.5% by weight aluminum ions) and a temperature of 38° C. Thereafter, the aluminum sheet was washed with water by spraying. In this anodizing apparatus, a current supplied from a power source flowed to a first feeder electrode disposed in the first feed zone and then to the aluminum sheet through the electrolytic solution to form an oxide film on the surface of the aluminum sheet in the first electrolysis zone. The current then passed through an electrolysis electrode disposed in the first feed zone and returned to the power source. On the other hand, another current supplied from the power source flowed to a second feeder electrode disposed in the second feed zone and likewise to the aluminum sheet through the electrolytic solution to form an oxide film on the surface of the aluminum sheet in the second electrolysis zone. The quantity of electricity fed to the first feed zone from the power source was equal to that fed to the second feed zone from the power source. The current density in the surface of the oxide film in the second feed zone was about 25 A/dm². In the second feed zone, electricity was fed through the oxide film, which weighed 1.35 g/m². The amount of the oxide film finally obtained was 2.7 g/m². The aluminum support obtained through the steps described above is referred to as [AS-1].

[Hydrophilizing Treatment]

The aluminum support [AS-1] was treated with a silicate in order to enhance hydrophilicity, required of the nonimage areas of a printing plate. In this treatment, the aluminum web was passed through a 1.5% aqueous solution of #3 sodium silicate kept at 70° C., in such a manner that the web/solution contact time was 15 seconds. Thereafter, the web was washed with water. As a result, silicon was deposited in an amount of 10 mg/m². This support is referred to as [AS-2].

[Formation of Interlayer]

A liquid composition (sol) was prepared by the SG method in the following manner. The respective amounts of the following ingredients were weighed in a breaker. This mixture was stirred at 25° C. for 20 minutes.

| | |
|---|---|
| Tetraethoxysilane | 38 g |
| 3-Methacryloxypropyltrimethoxysilane | 13 g |
| 85% Aqueous phosphoric acid solution | 12 g |
| Ion-exchanged water | 15 g |
| Methanol | 100 g |

The resultant solution was transferred to a three-necked flask. A reflux condenser was attached thereto, and this three-necked flask was partly immersed in a room-temperature oil bath. The temperature of the oil bath was elevated to 50° C. over 30 minutes while stirring the contents of the three-necked flask with a magnetic stirrer. The mixture was allowed to react for further 1 hour while keeping the bath temperature at 50° C. Thus, a liquid composition (sol) was obtained. This sol was diluted with a methanol/ethylene glycol (20/1 by weight) mixture to a concentration of 0.5% by weight. The dilute sol was applied to the aluminum support [AS-1] with a whirler and the coating was dried at 100° C. for 1 minute. Thus, a coating layer was formed in an amount of 3.5 mg/m². This coating amount was the amount of silicon element determined by fluorescent X-ray spectroscopy. The support thus produced is referred to as [AS-3].

Subsequently, a liquid having the following composition was applied to the aluminum support [AS-2] with a wire-wound bar. The coating was dried with a hot-air drying oven at 90° C. for 30 seconds. The amount of the coating dried was 10 mg/m².

| | |
|---|---|
| Copolymer of ethyl methyacrylate and sodium 2-acrylamido-2-methyl-1-propanesulfonate (75:15 by mol) | 0.1 g |
| 2-Aminoethylphosphonic acid | 0.1 g |
| Methanol | 50 g |
| Ion-exchanged water | 50 g |

The support thus produced is referred to as [AS-4].

A liquid having the following composition was applied to the aluminum support [AS-1] with a wire-wound bar. The coating was dried with a hot-air drying oven at 100° C. for 30 seconds. The amount of the coating dried was 30 mg/m².

| | |
|---|---|
| Crosslinkable quaternary-ammonium-salt polymer represented by the following formula (weight-average molecular weight determined by GPC, 50,000) | 0.75 g |
| Methanol | 200 g |

The support thus produced is referred to as [AS-5].

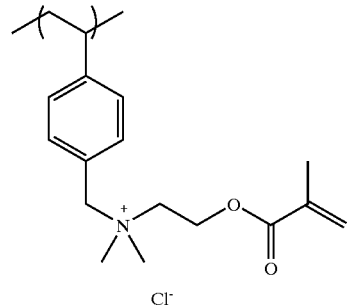

A liquid having the following composition was applied to the aluminum support [AS-1] with a wire-wound bar. The coating was dried with a hot-air drying oven at 100° C. for 30 seconds. The amount of the coating dried was 10 mg/m².

| | |
|---|---|
| Phenylphosphonic acid | 0.25 g |
| Methanol | 200 g |

The support thus produced is referred to as [AS-6].

[Formation of Photosensitive Layer]

A negative type photosensitive composition having the following makeup was applied to each of the aluminum sheets thus treated, in such an amount as to result in the dry coating amount shown in Table 2. The coating was dried at 100° C. for 1 minute to form a photosensitive layer.

| (Negative Photosensitive Composition) | |
|---|---|
| Addition-polymerizable compound as optional ingredient (compound shown in Table 2) | 1.5 g |
| Binder polymer (compound shown in Table 2) | 2.0 g |
| Sensitizing dye (compound shown in Table 2) | 0.2 g |
| Photopolymerization initiator (compound shown in Table 2) | 0.4 g |
| Co-sensitizing dye (compound shown in Table 2) | 0.4 g |
| Fluorochemical nonionic surfactant (Megafac F-177, manufactured by Dainippon Ink & Chemicals Inc.) | 0.03 g |
| Heat-polymerization inhibitor (N-nitrosophenylhydroxylamine aluminum salt) | 0.01 g |
| Coloring-pigment dispersion having the following composition | 2.0 g |
| Methyl ethyl ketone | 20.0 g |
| Propylene glycol monomethyl ether | 20.0 g |
| (Composition of Coloring-Pigment Dispersion) | |
| Pigment Blue 15:6 | 15 pts. wt. |
| Allyl methacrylate/methacrylic acid copolymer (comonomer proportion: 80/20; weight-average molecular weight: 40,000) | 10 pts. wt. |
| Cyclohexanone | 15 pts. wt. |

| | |
|---|---|
| -continued | |
| Methoxypropyl acetate | 20 pts. wt. |
| Propylene glycol monomethyl ether | 40 pts. wt. |

[Formation of Protective Layer]

A 3% by weight aqueous solution of a poly(vinyl alcohol) (degree of saponification, 98 mol %; degree of polymerization, 550) was applied to the photosensitive layer in an amount of 2 g/m² in terms of dry coating amount. The coating was dried at 100° C. for 2 minutes.

[Exposure of Negative Photosensitive Lithographic Printing Plates]

Using an FD-YAG (532 nm) laser exposure apparatus (plate setter Gutenberg, manufactured by Heidelberg), the negative photosensitive lithographic printing plates thus obtained were subjected to solid-image exposure and dot image exposure, which was conducted under the conditions of 2,540 dpi, 175 lines per inch, and dot percents increasing from 1 to 99% by percents, while regulating the exposure power so as to result in an exposure energy density of 200 µJ/cm² as measured on the plate surface.

[Development/Platemaking]

Into automatic processor FLP-813, manufactured by Fuji Photo Film Co., Ltd., were introduced the developing solution shown in Table 3 and finisher FP-2W, manufactured by Fuji Photo Film Co., Ltd. Each plate which had been exposed was developed under the conditions of a developing solution temperature of 30° C. and a developing time of 18 seconds. Thus, lithographic printing plates were obtained.

[Image Area Press Life Test]

Printing machine R201, manufactured by Rolland, was used together with Graph G (N), manufactured by Dainippon Ink & Chemicals Inc., as an ink. The solid-image part of each printed matter was examined. The press life of the image areas was evaluated in terms of the number of printed sheets obtained by the time when the image began to be blurred. The larger the number, the better the press life.

[Forced Dot Area Press Life Test]

Printing machine R201, manufactured by Rolland, was used together with Graph G (N), manufactured by Dainippon Ink & Chemicals Inc., as an ink. At the time when 5,000 sheets had been printed since printing initiation, the dot areas were wiped with a printing sponge impregnated with PS plate cleaner CL-2, manufactured by Fuji Photo Film Co., Ltd., to remove the ink adherent to the plate surface. Thereafter, 10,000 sheets were printed, and the printed matters obtained were visually examined for blind spots in the dot images.

EXAMPLES 21 TO 30 AND COMPARATIVE EXAMPLES 5 TO 7

The negative photosensitive lithographic printing plates shown in Table 3 were evaluated for performances in the same manner as in Examples 1 to 20.

The compounds given in Tables 2 and 3 are as follows.

[Addition-Polymerizable Compounds]

M-1: Pentaerythritol tetraacrylate (NK Ester A-TMMT, manufactured by Shin-Nakamura Chemical Co., Ltd.)

M-2: Glycerol dimethacrylate/hexamethylene diisocyanate urethane prepolymer (UA101H, manufactured by Kyoeisha Chemical Co., Ltd.)

M-3: Dipentaerythritol acrylate (NK Ester A-9530, manufactured by Shin-Nakamura Chemical Co., Ltd.)

[Photopolymerization Initiator Materials in Tables 2 and 3]

I-1
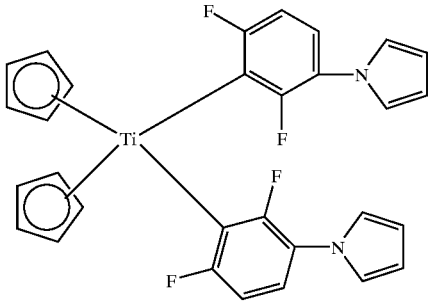

I-2
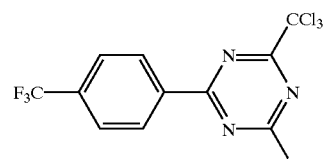

S-1
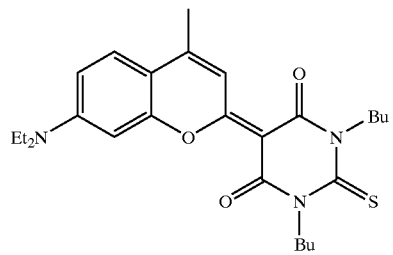

S-2
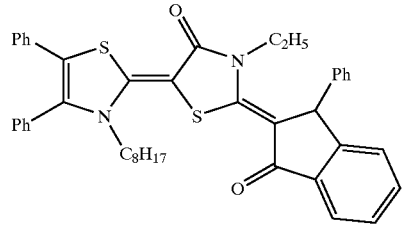

C-1
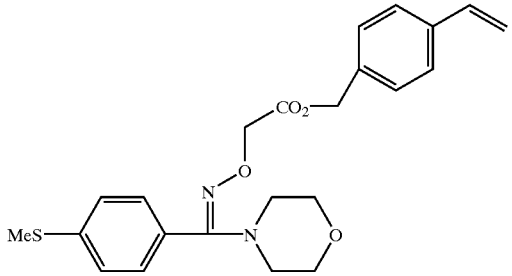

C-2
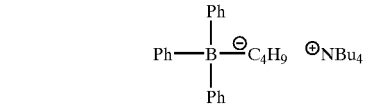

C-3
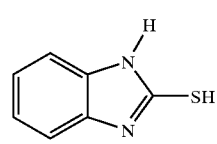

[Binder Polymers in Tables 2 and 3]

PA-1:

Allyl methacrylate/methacrylic acid copolymer (comonomer proportion, 80/20 by mole)

Acid value determined by NaOH titration, 1.70 meq/g

Weight-average molecular weight determined by GPC, 48,000

PA-2:

Methyl methacrylate/acrylonitrile/N-[(4-sulfamoyl) phenyl]-methacrylamide copolymer (comonomer proportion, 37/30/33 by mole)

Weight-average molecular weight determined by GPC, 49,000

PA-3:

Polyurethane resin which is a condensation polymer of the following diisocyanates and diols
4,4'-Diphenylmethane diisocyanate (MDI)
Hexamethylene diisocyanate (HMDI)
Polypropylene glycol; weight-average molecular weight, 1,000 (PPG1000)
2,2-Bis(hydroxymethyl)propionic acid (DMPA)
Comonomer proportion (MDI/HMDI/PPG1000/DMPA), 40/10/15/35 by mole Acid value determined by NaOH titration, 1.05 meq/g Weight-average molecular weight determined by GPC, 45,000

[Developing Solutions]

D-1:

Aqueous solution of pH 10 having the following composition

| | |
|---|---|
| Monoethanolamine | 0.1 pt. wt. |
| Triethanolamine | 1.5 pts. wt. |
| Compound of the following formula 1 | 4.0 pts. wt. |
| Compound of the following formula 2 | 2.5 pts. wt. |
| Compound of the following formula 3 | 0.2 pts. wt. |
| Water | 91.7 pts. wt. |

(FORMULA 1)

(FORMULA 2)

(FORMULA 3)

In formula 1 given above, $R^{14}$ represents a hydrogen atom or butyl group.

D-2:

Aqueous solution having the following composition

| | |
|---|---|
| Potassium hydrogen disilicate | 3.0 pts. wt. |
| Potassium hydroxide | 1.5 pts. wt. |
| Compound of the formula 3 given above | 0.2 pts. wt. |
| Water | 95.3 pts. wt. |

TABLE 2

| | | Photosensitive layer | | | | | | | Press life | |
|---|---|---|---|---|---|---|---|---|---|---|
| No. | Support | Addition-polymerizable compound | Binder polymer | Photopolymerization initiator | Sensitizing dye | Co-sensitizer | Dry coating amount (g/m²) | Developing solution | Image area (× 10000 sheets) | Dot area |
| Ex. 1 | AS-1 | M-1 | P-1 | I-1 | S-1 | C-1 | 1.2 | D-2 | 27 | excellent |
| Ex. 2 | AS-1 | M-1 | P-2 | I-1 | S-2 | C-1 | 1.3 | D-2 | 24 | good |
| Ex. 3 | AS-5 | none | P-3 | I-2 | S-1 | C-3 | 1.4 | D-2 | 31 | excellent |
| Ex. 4 | AS-2 | M-3 | P-4 | I-1 | S-2 | C-1 | 1.4 | D-1 | 35 | good |
| Ex. 5 | AS-3 | M-2 | P-5 | I-1 | S-2 | C-2 | 1.3 | D-2 | 35 | good |
| Ex. 6 | AS-4 | none | P-6 | I-2 | S-1 | C-3 | 1.6 | D-2 | 24 | excellent |
| Ex. 7 | AS-6 | M-1 | P-7 | I-1 | S-1 | C-2 | 1.2 | D-2 | 23 | good |
| Ex. 8 | AS-3 | none | P-8 | I-2 | S-2 | C-1 | 1.4 | D-2 | 42 | excellent |
| Ex. 9 | AS-1 | M-2 | P-9 | I-2 | S-1 | C-1 | 1.5 | D-2 | 31 | excellent |
| Ex. 10 | AS-5 | M-1 | P-10 | I-2 | S-2 | C-2 | 1.5 | D-1 | 39 | excellent |
| Ex. 11 | AS-3 | M-2 | P-11 | I-1 | S-2 | C-1 | 1.4 | D-2 | 25 | good |
| Ex. 12 | AS-2 | none | P-12 | I-1 | S-2 | C-1 | 1.3 | D-2 | 24 | excellent |
| Ex. 13 | AS-1 | M-3 | P-13 | I-2 | S-1 | C-1 | 1.4 | D-2 | 30 | excellent |
| Ex. 14 | AS-5 | M-3 | P-14 | I-1 | S-2 | C-3 | 1.7 | D-1 | 26 | excellent |
| Ex. 15 | AS-6 | M-1 | P-15 | I-2 | S-1 | C-1 | 1.4 | D-2 | 27 | good |
| Ex. 16 | AS-4 | M-2 | P-16 | I-1 | S-2 | C-1 | 1.3 | D-1 | 24 | excellent |
| Ex. 17 | AS-1 | none | P-17 | I-2 | S-1 | C-1 | 1.5 | D-2 | 25 | good |
| Ex. 18 | AS-3 | M-3 | P-18 | I-1 | S-2 | C-3 | 1.7 | D-1 | 38 | excellent |
| Ex. 19 | AS-1 | M-3 | P-19 | I-1 | S-2 | C-3 | 1.5 | D-1 | 30 | good |
| Ex. 20 | AS-6 | M-1 | P-20 | I-2 | S-1 | C-1 | 1.4 | D-2 | 27 | good |
| Comp. Ex. 1 | AS-5 | M-1 | PR-1 | I-1 | S-1 | C-1 | 1.4 | D-2 | 5 | blind spots |
| Comp. Ex. 2 | AS-3 | M-3 | PR-2 | I-2 | S-2 | C-1 | 1.4 | D-2 | 3 | blind spots |

TABLE 2-continued

| | | Photosensitive layer | | | | | | | Press life | |
| | | Addition-polymerizable compound | Binder polymer | Photopolymerization initiator | Sensitizing dye | Co-sensitizer | Dry coating amount (g/m$^2$) | Developing solution | Image area (× 10000 sheets) | Dot area |
| No. | Support | | | | | | | | | |
|---|---|---|---|---|---|---|---|---|---|---|
| Comp. Ex. 3 | AS-1 | M-2 | PR-3 | I-1 | S-1 | C-2 | 1.4 | D-2 | no image formed | |
| Comp. Ex. 4 | AS-6 | M-2 | PR-4 | I-2 | S-2 | C-2 | 1.4 | D-2 | no image formed | |

TABLE 3

| | | Photosensitive layer | | | | | | | | Press life | |
| | | Addition-polymerizable | Binder polymer | | Weight ratio | Photopolymerization | Sensitizing | Co- | Dry coating amount | Developing | Image area (× 10000 | |
| No. | Support | compound | 1 | 2 | (1:2) | initiator | dye | sensitizer | (g/m$^2$) | solution | sheets) | Dot area |
|---|---|---|---|---|---|---|---|---|---|---|---|---|
| Ex. 21 | AS-1 | none | P-1 | P-6 | 5/5 | I-1 | S-2 | C-1 | 1.4 | D-2 | 30 | good |
| Ex. 22 | AS-3 | M-3 | P-3 | P-9 | 6/4 | I-1 | S-1 | C-1 | 1.2 | D-2 | 28 | good |
| Ex. 23 | AS-6 | M-2 | P-4 | P-10 | 7/3 | I-2 | S-1 | C-2 | 1.2 | D-2 | 34 | good |
| Ex. 24 | AS-2 | M-2 | P-9 | P-18 | 8/2 | I-1 | S-2 | C-1 | 1.4 | D-1 | 33 | good |
| Ex. 25 | AS-3 | M-1 | P-10 | P-11 | 9/1 | I-2 | S-2 | C-3 | 1.4 | D-1 | 21 | excellent |
| Ex. 26 | AS-6 | none | P-17 | P-20 | 3/7 | I-2 | S-1 | C-1 | 1.6 | D-2 | 24 | excellent |
| Ex. 27 | AS-1 | none | P-1 | PA-1 | 8/2 | I-1 | S-1 | C-1 | 1.4 | D-2 | 21 | excellent |
| Ex. 28 | AS-4 | M-3 | P-1 | PA-2 | 5/5 | I-1 | S-1 | C-1 | 1.4 | D-1 | 23 | excellent |
| Ex. 29 | AS-3 | M-2 | P-6 | PA-3 | 7/3 | I-2 | S-2 | C-3 | 1.7 | D-1 | 22 | excellent |
| Ex. 30 | AS-5 | M-1 | P-18 | PR-3 | 7/3 | I-2 | S-2 | C-1 | 1.2 | D-1 | 27 | good |
| Comp. Ex. 5 | AS-3 | M-2 | PR-1 | PR-4 | 5/5 | I-2 | S-2 | C-1 | 1.3 | D-2 | 3 | blind spots |
| Comp. Ex. 6 | AS-2 | M-2 | PR-2 | PA-1 | 8/2 | I-1 | S-1 | C-1 | 1.5 | D-1 | 1 | blind spots |
| Comp. Ex. 7 | AS-5 | none | PR-3 | PA-1 | 9/1 | I-1 | S-1 | C-3 | 1.5 | D-3 | no image formed | |

EXAMPLES 31 TO 40 AND COMPARATIVE EXAMPLES 8 TO 10

The negative photosensitive lithographic printing plates shown in Table 4 were produced. A semiconductor laser having a wavelength of 405 nm was used as an illuminator to conduct exposure while regulating the exposure power so as to result in an exposure energy density of 30 μJ/cm$^2$ as measured on the plate surface. The printing plates obtained were evaluated for performances in the same manner as in Examples 1 to 30.

TABLE 4

| | | Photosensitive layer | | | | | | | Press life | |
| | | Addition-polymerizable compound | Binder polymer | Photopolymerization initiator | Sensitizing dye | Co-sensitizer | Dry coating amount (g/m$^2$) | Developing solution | Image area (× 10000 sheets) | Dot area |
| No. | Support | | | | | | | | | |
|---|---|---|---|---|---|---|---|---|---|---|
| Ex. 31 | AS-1 | M-1 | P-11 | I-1 | S-3 | C-1 | 1.4 | D-2 | 25 | good |
| Ex. 32 | AS-2 | none | P-12 | I-1 | S-3 | C-1 | 1.3 | D-2 | 24 | excellent |
| Ex. 33 | AS-6 | M-3 | P-13 | I-2 | S-4 | C-2 | 1.4 | D-2 | 30 | excellent |
| Ex. 34 | AS-3 | M-2 | P-14 | I-1 | S-3 | C-3 | 1.7 | D-1 | 26 | excellent |
| Ex. 35 | AS-6 | M-1 | P-15 | I-2 | S-4 | C-1 | 1.4 | D-2 | 27 | good |
| Ex. 36 | AS-4 | M-2 | P-16 | I-1 | S-4 | C-1 | 1.3 | D-1 | 24 | excellent |
| Ex. 37 | AS-1 | none | P-17 | I-2 | S-3 | C-2 | 1.5 | D-2 | 25 | good |
| Ex. 38 | AS-3 | M-3 | P-18 | I-1 | S-3 | C-3 | 1.7 | D-1 | 38 | excellent |
| Ex. 39 | AS-1 | M-2 | P-19 | I-1 | S-4 | C-3 | 1.5 | D-1 | 30 | good |
| Ex. 40 | AS-5 | M-1 | P-20 | I-2 | S-3 | C-1 | 1.4 | D-2 | 27 | good |
| Comp. Ex. 8 | AS-3 | M-1 | PR-1 | I-1 | S-4 | C-3 | 1.4 | D-2 | 5 | blind spots |
| Comp. Ex. 9 | AS-3 | M-3 | PR-3 | I-2 | S-3 | C-1 | 1.4 | D-1 | no image formed | |
| Comp. Ex. 10 | AS-1 | none | PR-4 | I-1 | S-4 | C-2 | 1.4 | D-2 | no image formed | |

[Sensitizing Dyes in Table 4]

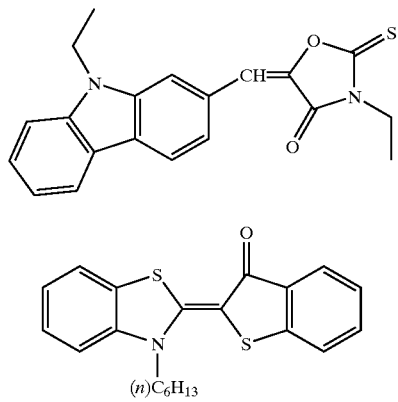

S-3

S-4

EXAMPLES 41 TO 60 AND COMPARATIVE EXAMPLES 11 TO 14

[Formation of Photosensitive Layer]

The coating fluid for photosensitive-layer formation shown below was prepared and applied to the aluminum support [AS-4] with a wire-wound bar in such an amount as to result in the dry coating amount shown in Table 1. The coating was dried with a hot-air drying oven at 115° C. for 45 seconds to form a photosensitive layer.

Coating Fluid for Photosensitive-Layer Formation:

| | |
|---|---|
| Addition-polymerizable compound (compound shown in Table 5) | 1.0 g |
| Binder polymer (compound shown in Table 5) | 1.0 g |
| Infrared absorber (IR-1) | 0.08 g |
| Heat-polymerization initiator (compound shown in Table 5) | 0.3 g |
| Fluorochemical nonionic surfactant (Megafac F-176, manufactured by Dainippon Ink & Chemicals Inc.) | 0.01 g |
| Victoria Pure Blue naphthalenesulfonate | 0.04 g |
| Methyl ethyl ketone | 9.0 g |
| Propylene glycol monomethyl ether | 8.0 g |
| Methanol | 10.0 g |

[Formation of Protective Layer]

A 3% by weight aqueous solution of a poly(vinyl alcohol) (degree of saponification, 98 mol %; degree of polymerization, 550) was applied according to need to the photosensitive layer in an amount of 2 g/m$^2$ in terms of dry coating amount. The coating was dried at 100° C. for 2 minutes.

[Exposure of Negative Photosensitive Lithographic Printing Plates]

The negative photosensitive lithographic printing plates thus obtained were exposed with Trendsetter 3244 VFS, manufactured by Creo and equipped with a water-cooled 40-W infrared semiconductor laser, under the conditions of an output of 9 W, external-drum rotational speed of 210 rpm, plate-surface energy of 100 mJ/cm$^2$, and resolution of 2,400 dpi.

[Development/Platemaking]

After the exposure, the developing solution shown in Table 5 and a solution obtained by diluting finisher FN-6, manufactured by Fuji Photo Film Co., Ltd., with water in a ratio of 1:1 were introduced into automatic processor Stabron 900N, manufactured by Fuji Photo Film Co., Ltd. The plates exposed were developed at 30° C. to obtain lithographic printing plates.

[Image Area Press Life Test]

Printing machine Lithrone, manufactured by Komori Corp., was used together with Graph G (N), manufactured by Dainippon Ink & Chemicals Inc., as an ink. The solid-image part of each printed matter was examined. The press life of the image areas was evaluated in terms of the number of printed sheets obtained by the time when the image began to be blurred. The larger the number, the better the press life.

[Forced Dot Area Press Life Test]

Printing machine Lithrone, manufactured by Komori Corp., was used together with Graph G (N), manufactured by Dainippon Ink & Chemicals Inc., as an ink. At the time when 5,000 sheets had been printed since printing initiation, the dot areas were wiped with a printing sponge impregnated with PS plate cleaner CL-2, manufactured by Fuji Photo Film Co., Ltd., to remove the ink adherent to the plate surface. Thereafter, 10,000 sheets were printed, and the printed matters obtained were visually examined for blind spots in the dot images.

TABLE 5

| | | Photosensitive layer | | | | | | | Press life | |
|---|---|---|---|---|---|---|---|---|---|---|
| No. | Support | Addition-polymerizable compound | Binder polymer 1 | Binder polymer 2 | Weight ratio (1:2) | Heat-polymerization initiator | Dry coating amount (g/m$^2$) | Protective layer | Developing solution | Image area (× 10000 sheets) | Dot area |
| Ex. 41 | AS-4 | none | P-1 | none | — | OI-1 | 1.4 | none | D-3 | 38 | excellent |
| Ex. 42 | AS-5 | M-3 | P-2 | none | — | OI-1 | 1.2 | present | D-3 | 40 | good |
| Ex. 43 | AS-1 | M-2 | P-3 | none | — | OI-2 | 1.2 | none | D-1 | 25 | good |
| Ex. 44 | AS-4 | M-1 | P-5 | none | — | OI-1 | 1.2 | present | D-1 | 33 | excellent |
| Ex. 45 | AS-2 | M-3 | P-6 | none | — | OI-2 | 1.3 | none | D-3 | 21 | excellent |
| Ex. 46 | AS-5 | M-3 | P-7 | none | — | OI-3 | 1.1 | none | D-3 | 28 | excellent |
| Ex. 47 | AS-6 | M-2 | P-9 | none | — | OI-1 | 1.3 | present | D-3 | 32 | excellent |
| Ex. 48 | AS-6 | M-2 | P-10 | none | — | OI-1 | 1.3 | none | D-2 | 23 | excellent |
| Ex. 49 | AS-1 | none | P-11 | none | — | OI-2 | 1.3 | present | D-2 | 36 | excellent |
| Ex. 50 | AS-3 | none | P-13 | none | — | OI-2 | 1.5 | present | D-1 | 27 | good |
| Ex. 51 | AS-2 | M-3 | P-16 | none | — | OI-3 | 1.2 | present | D-3 | 30 | good |
| Ex. 52 | AS-1 | M-3 | P-18 | none | — | OI-1 | 1.3 | none | D-3 | 24 | good |
| Ex. 53 | AS-4 | M-3 | P-20 | none | — | OI-2 | 1.4 | none | D-2 | 34 | good |

TABLE 5-continued

| | | Photosensitive layer | | | | | | | Press life | |
| | | Addition-polymer-izable | Binder polymer | | Weight ratio | Heat-poly-merization | Dry coating amount | Protective | Develop-ing | Image area | |
| No. | Support | compound | 1 | 2 | (1:2) | initiator | (g/m²) | layer | solution | (× 10000 sheets) | Dot area |
| Ex. 54 | AS-4 | M-2 | P-1 | P-6 | 8/2 | OI-1 | 1.2 | present | D-3 | 33 | good |
| Ex. 55 | AS-5 | M-1 | P-5 | P-16 | 9/1 | OI-3 | 1.2 | none | D-1 | 21 | excellent |
| Ex. 56 | AS-4 | M-3 | P-17 | P-20 | 8/2 | OI-2 | 1.3 | none | D-2 | 24 | excellent |
| Ex. 57 | AS-4 | M-2 | P-1 | PR-1 | 8/2 | OI-2 | 1.3 | none | D-1 | 36 | excellent |
| Ex. 58 | AS-5 | none | P-1 | PA-1 | 5/5 | OI-1 | 1.4 | present | D-1 | 23 | excellent |
| Ex. 59 | AS-3 | M-2 | P-2 | PA-2 | 7/3 | OI-1 | 1.1 | none | D-3 | 22 | excellent |
| Ex. 60 | AS-1 | M-3 | P-5 | PR-3 | 7/3 | OI-2 | 1.3 | none | D-2 | 27 | good |
| Comp. Ex. 11 | AS-1 | M-3 | PR-1 | PR-4 | 5/5 | OI-1 | 1.3 | present | D-1 | 9 | good |
| Comp. Ex. 12 | AS-4 | M-2 | PR-2 | none | — | OI-1 | 1.2 | present | D-3 | 5 | blind spots |
| Comp. Ex. 13 | AS-5 | M-3 | PR-3 | none | — | OI-3 | 1.4 | present | D-2 | no image formed | |
| Comp. Ex. 14 | AS-6 | M-3 | PR-4 | PA-1 | 9/1 | OI-3 | 1.5 | none | D-2 | no image formed | |

[Heat-Polymerization Initiators in Table 5]

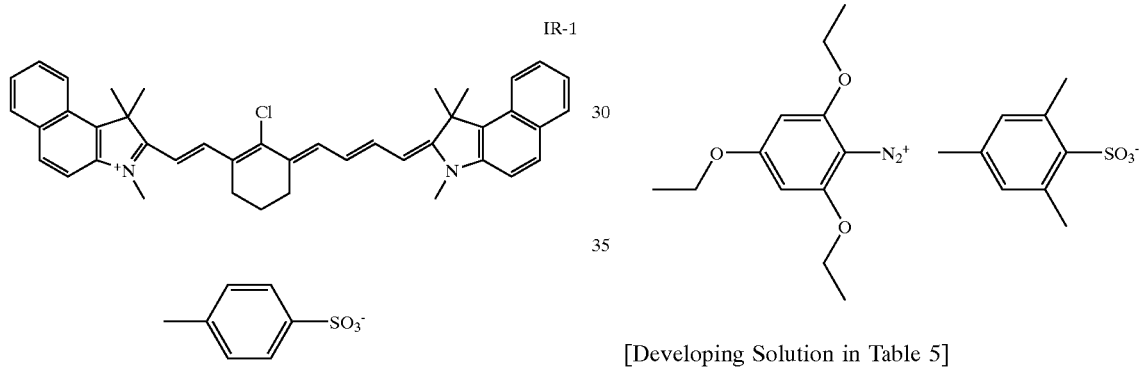

[Developing Solution in Table 5]
D-3:

| | |
|---|---|
| Sodium carbonate monohydrate | 10 g |
| Potassium hydrogen carbonate | 10 g |
| Sodium isopropylnaphthalenesulfonate | 15 g |
| Sodium dibutylnaphthalenesulfonate | 15 g |
| Sodium salt of ethylene glycol mononaphthyl ether monosulfate | 10 g |
| Sodium sulfite | 1 g |
| Tetrasodium ethylenediaminetetraacetate | 0.1 g |
| Ion-exchanged water | 938.9 g |

Tables 2 to 5 show that printing plates having exceedingly high press life were obtained from the negative photosensitive lithographic printing plates having a photosensitive layer containing a modified poly(vinyl alcohol) resin binder according to the invention and a photo- or heat-polymerization initiator.

The negative photosensitive lithographic printing plate of the invention gives a lithographic printing plate having exceedingly high press life because it has a photosensitive layer containing a modified poly(vinyl alcohol) resin binder according to the invention and a photo- or heat-polymerization initiator. The negative photosensitive lithographic printing plate of the invention is suitable for scanning exposure to a laser beam, is capable of high-speed writing, and further attains high printing plate productivity.

The entire disclosure of each and every foreign patent application from which the benefit of foreign priority has been claimed in the present application is incorporated herein by reference, as if fully set forth.

What is claimed is:

1. A negative photosensitive lithographic printing plate comprising a support and a photosensitive layer containing a modified poly(vinyl alcohol) resin binder having a radical-polymerizable group and an acid group, and an infrared absorber.

2. The negative photosensitive lithographic printing plate as claimed in claim 1, wherein the infrared absorber is a dye or pigment having an absorption maximum at a wavelength between 760 and 1200 nm.

3. The negative photosensitive lithographic printing plate as claimed in claim 1, wherein the photosensitive layer further contains a heat-decomposable radical generator.

4. The negative photosensitive Lithographic printing plate as claimed in claim 3, wherein the heat-decomposable radical generator is an onium salt selected from the group consisting of an iodonium slat, diazonium salt and sulfonium salt.

5. The negative photosensitive lithographic printing plate as claimed in claim 1, wherein the modified poly(vinyl alcohol) resin binder having a radical-polymerizable group and an acid group contains a repeating unit having a radical polymerizable group represented by formula (I) and a repeating unit having an acid group represented by formula (III):

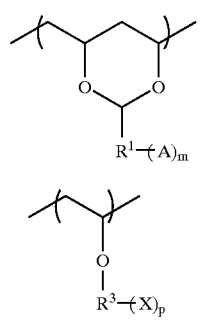

wherein A independently represents a radical-polymerizable group, X represents an acid group; $R^1$ and $R^3$ each independently represents a substituted or unsubstituted hydrocarbon group having 1 to 30 carbon atoms, and $R^1$ and $R^3$ each has a valent of (m+1) and (p+1) respectively; and m and p each independently represents an integer of 1 to 5.

6. The negative photosensitive lithographic printing plate as claimed in claim 1, wherein the modified poly(vinyl alcohol) resin binder having a radical-polymerizable group and an acid group contains a repeating unit having a radical-polymerizable group represented by formula (II) and a repeating unit having an acid group represented by formula (III):

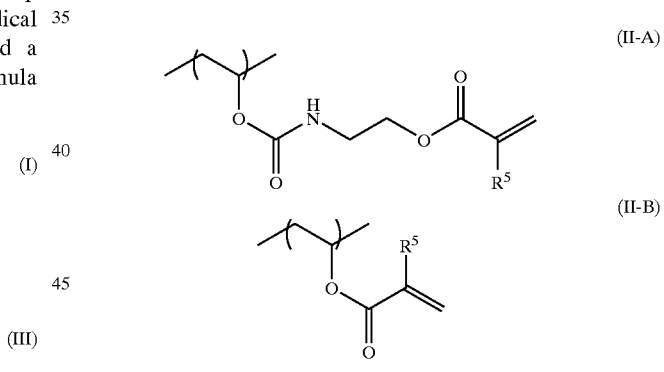

wherein B independently represents a radical-polymerizable group, X represents an acid group; $R^2$ and $R^3$ each independently represents a substituted or unsubstituted hydrocarbon group having 1 to 30 carbon atoms, and $R^2$ and $R^3$ each has a valent of (n+1) and (p+1) respectively; and n and p each independently represents an integer of 1 to 5.

7. The negative photosensitive lithographic printing plate as claimed in claim 6, wherein, in the repeating unit containing a radical-polymerizable group represented by formula (II), B as the radical-polymerizable group is selected from the group consisting of a (meth)acrylamide group, an allyl group, a styrene structure, a vinyl ether structure and an acetylene structure.

8. The negative photosensitive lithographic printing plate as claimed in claim 6 wherein the repeating unit having a radical-polymerizable group represented by formula (II) is represented by at least one of formula (II-A) and formula (II-B):

wherein $R^5$ represents a hydrogen atom or methyl group.

9. A method of plate-making a negative photosensitive lithographic printing plate, which comprises exposing the negative photosensitive lithographic printing plate as claimed in claim 1 to a laser light of 760 to 1200 nm wavelength, and thereafter developing the exposed plate.

10. A negative photosensitive lithographic printing plate comprising a support and a photosensitive layer which contains: a modified poly(vinyl alcohol) resin binder having a radical-polymerizable group and an acid group; and a photopolymerization initiator, wherein the modified poly(vinyl alcohol) resin binder having a radical-polymerizable group and an acid group contains a repeating unit having a radical-polymerizable group represented by formula (I) and a repeating unit having an acid group represented by formula (III)

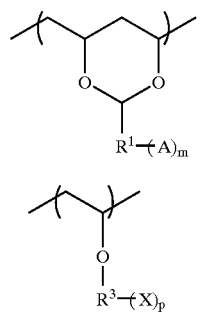

(I)

(III)

wherein A independently represents a radical-polymerizable group, X represents an acid group; $R^1$ and $R^3$ each independently represents a substituted or unsubstituted hydrocarbon group having 1 to 30 carbon atoms, and $R^1$ and $R^3$ each has a valent of (m+1) and (p+1) respectively; and m and p each independently represents an integer of 1 to 5.

11. A negative photosensitive lithographic printing plate comprising a support and a photosensitive layer which contains: a modified poly(vinyl alcohol) resin binder having a radical-polymerizable group and an acid group; and a photopolymerization initiator, wherein the photopolymerization initiator includes a titanocene compound, and the modified poly(vinyl alcohol) resin binder having a radical-polymerization group and an acid group contains a repeating unit having a radical-polymerizable group represented by formula (II) and a repeating unit having an acid group represented by formula (III)

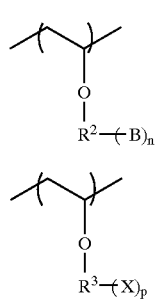

(II)

(III)

wherein B independently represents a radical-polymerizable group, X represents an acid group; $R^2$ and $R^3$ each independently represents a substituted or unsubstituted hydrocarbon group having 1 to 30 carbon atoms, and $R^2$ and $R^3$ each has a valent of (n+1) and (p+1) respectively; and n and p each independently represents an integer of 1 to 5.

12. The negative photosensitive lithographic printing plate as claimed in claim 11 wherein, in the repeating unit containing a radical-polymerizable group represented by formula (II), A as the radical-polymerizable group is selected from the group consisting of a (meth)acrylamide group, an allyl group, a styrene structure, a vinyl ether structure and an acetylene structure.

13. A method of plate-making a negative photosensitive lithographic printing plate, which comprises exposing the negative photosensitive lithographic printing plate as claimed in claim 11 to a laser light that has a wavelength longer than 400 nm and shorter than 760 nm and thereafter developing the exposed plate.

14. A negative photosensitive lithographic printing plate comprising a support and a photosensitive layer which contains: a modified poly(vinyl alcohol) resin binder having a radical-polymerizable group and an acid group; and a photopolymerization initiator, wherein the modified poly (vinyl alcohol) resin binder having a radical-polymerizable group and an acid group includes a repeating Unit having a radical-polymerizable group represented by at least one of formula (II-A) and formula (II-B) and a repeating unit having an acid group represented by formula (III):

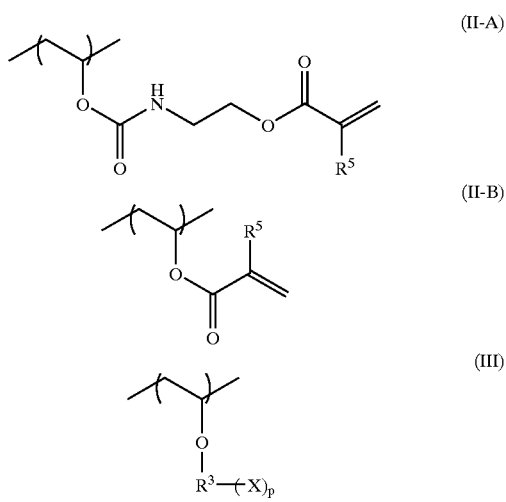

wherein $R^5$ represents a hydrogen atom or methyl group, X represents an acid group, $R^3$ represents a substituted or unsubstituted hydrocarbon group having 1 to 30 carbon atoms, and has a valent of (p+1); and p represents an integer of 1 to 5.

15. The negative photosensitive lithographic printing plate as claimed in claim 14, wherein the photopolymerization initiator is a titanocene compound.

16. A method of plate-making a negative photosensitive lithographic printing plate, which comprises exposing the negative photosensitive lithographic printing plate as claimed in claim 14 to a laser light that has a wavelength longer than 400 nm and shorter than 760 nm and thereafter developing the exposed plate.

* * * * *